United States Patent
Hikasa

(10) Patent No.: US 9,748,229 B2
(45) Date of Patent: Aug. 29, 2017

(54) SEMICONDUCTOR DEVICE

(71) Applicant: ROHM CO., LTD., Kyoto (JP)

(72) Inventor: Akihiro Hikasa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/954,867

(22) Filed: Nov. 30, 2015

(65) Prior Publication Data

US 2016/0086941 A1  Mar. 24, 2016

Related U.S. Application Data

(63) Continuation of application No. 14/470,889, filed on Aug. 27, 2014, now Pat. No. 9,236,461.

(30) Foreign Application Priority Data

Aug. 28, 2013 (JP) .................. 2013-176916
Aug. 28, 2013 (JP) .................. 2013-176917
Aug. 8, 2014 (JP) .................. 2014-162950

(51) Int. Cl.
*H01L 29/66* (2006.01)
*H01L 27/07* (2006.01)
(Continued)

(52) U.S. Cl.
CPC ...... *H01L 27/0716* (2013.01); *H01L 29/0619* (2013.01); *H01L 29/0692* (2013.01);
(Continued)

(58) Field of Classification Search
None
See application file for complete search history.

(56) References Cited

U.S. PATENT DOCUMENTS 9,236,461 B2 * 1/2016 Hikasa .................. H01L 29/7397
2003/0042537 A1   3/2003 Nakamura et al.
(Continued)

FOREIGN PATENT DOCUMENTS

JP   4785334 B2   10/2011

OTHER PUBLICATIONS

Machida et al., "Investigation of Correlation between Device Structures and Switching Losses of IGBTs", The Institute of Electrical Engineers of Japan Electronics Material Research Group Data (EFM-09, 16-26, 28-29), 55-59.
(Continued)

*Primary Examiner* — Shaun Campbell
(74) *Attorney, Agent, or Firm* — Chen Yoshimura LLP

(57) ABSTRACT

A semiconductor device includes: an FET structure that is formed next to a looped trench on a semiconductor substrate and that has an $n^+$ emitter region and an $n^-$ drain region facing each other in the depth direction of the looped trench across a p-type base region; a p-type floating region formed on the side of the looped trench opposite to the FET structure; and an emitter connecting part that is electrically connected to the $n^+$ emitter region and a trench gate provided in the same trench, the emitter connecting part and the trench gate being insulated from each other by the looped trench. The trench gate faces the FET structure, and the emitter connecting part faces the p-type floating region, across an insulating film.

3 Claims, 31 Drawing Sheets

(51) Int. Cl.
    *H01L 29/739*    (2006.01)
    *H01L 29/08*     (2006.01)
    *H01L 29/423*    (2006.01)
    *H01L 29/417*    (2006.01)
    *H01L 29/06*     (2006.01)
    *H01L 29/10*     (2006.01)
    *H01L 29/78*     (2006.01)
    *H01L 29/40*     (2006.01)

(52) U.S. Cl.
    CPC ...... *H01L 29/0696* (2013.01); *H01L 29/0804* (2013.01); *H01L 29/1095* (2013.01); *H01L 29/41708* (2013.01); *H01L 29/4236* (2013.01); *H01L 29/7397* (2013.01); *H01L 29/7841* (2013.01); *H01L 29/404* (2013.01); *H01L 29/407* (2013.01)

(56) References Cited

U.S. PATENT DOCUMENTS

2010/0314681 A1* 12/2010 Hsieh .................. H01L 24/05
                                                                             257/328

2012/0061723 A1* 3/2012 Ishii .................. H01L 29/407
                                                                             257/139

2014/0339599 A1* 11/2014 Onozawa ............ H01L 29/4236
                                                                             257/139

OTHER PUBLICATIONS

Machida et al., "Investigation of Correlation between Device Structures and Switching Losses of IGBTs", Proceedings of the 21st International Symposium on Power Semiconductor Devices & IC's, Jun. 14-18, 2009, pp. 36-139, IEEE, Barcelona.

Watanabe et al., "1. /kV Trench IGBT with Deep and Separate Floating p-Layer Designed for Low Loss, Low EMI Noise, and High Reliability", The Institute of Electrical Engineers of Japan Electronic Devices Research Group Data (EDD-11, 66-83), 67-71.

Watanabe et al., "1.7kV Trench IGBT with Deep and Separate Floating p-Layer Designed for Low Loss, Low EMI Noise, and High Reliability", Proceedings of the 23rd International Symposium on Power Semiconductor Devices & IC's, May 23-26, 2011, pp. 48-51, IEEE, San Diego, CA.

\* cited by examiner

SEMICONDUCTOR DEVICE

BACKGROUND OF THE INVENTION

Technical Field

The present invention relates to a semiconductor device having elements such as IGBTs (insulated gate bipolar transistors), and a semiconductor device having a gate pad.

Trench gate IGBTs, which have a high saturation voltage $V_{CE}(\text{sat})$ and short-circuit resistance between collector emitters, conventionally have p-type floating regions. The p-type floating regions are generally diffused inside the drift layer so as to contact the trench gates. This drift layer is an epitaxial wafer or a pull-up wafer having approximately an equivalent resistance thereto.

RELATED ART DOCUMENTS

Patent Documents

Non-Patent Document 1: Satoru Machida, Takahide Sugiyama, Masayasu Ishiko, Satoshi Yasuda, Jun Saito, Kimimori Hamada. Investigation of Correlation between Device Structures and Switching Losses of IGBTs. *The Institute of Electrical Engineers of Japan Electronics Material Research Group Data* (EFM-09, 16-26, 28-29), 55-59

Non-Patent Document 2: So Watanabe, Mutsuhiro Mori, Taiga Arai, Kohsuke Ishibashi, Yasushi Toyoda, Tetsuo Oda, Takashi Harada, Katsuaki Saito. 1.7 kV Trench IGBT with Deep and Separate Floating p-Layer Designed for Low Loss, Low EMI Noise, and High Reliability. *The Institute of Electrical Engineers of Japan Electronic Devices Research Group Data* (EDD-11, 66-83), 67-71

Patent Document 1: Japanese Patent No. 4785334

SUMMARY OF THE INVENTION

In an IGBT having a structure in which the p-type floating regions and the trench gates are electrically connected, however, there is a high amount of stray capacitance in the area connecting the respective trench gates and the p-type floating regions, which causes an increase in switching loss. There is also a problem that switching noise occurs when this IGBT is switched on.

It cannot yet be said that technology for alleviating these types of switching loss and switching noise problems exists without sacrificing various characteristics of the semiconductor device such as ON voltage and short-circuit resistance.

Furthermore, in a semiconductor device having a gate pad, it is known that inrush current (di/dt) occurs when voltage is applied to this gate pad. This inrush current tends to flow through the gate pad or the surface of the gate metal wiring lines connected to the gate pad. Therefore, the inrush current flows into the gate structure close to the gate pad as surface current, which could result in the gate structure turning ON locally. The occurrence of this type of surface current does not merely cause variation in the applied current between the plurality of gate structures; it is also a cause of switching loss when the respective IGBTs are turned ON.

An LC resonant circuit is ordinarily formed by parasitic inductance and parasitic capacitance, so if surface current flows to the gate pad formed around the gate structure and the gate metal wiring lines, the switching of the gate structure will trigger resonance noise. As a result, switching loss during switching-ON increases.

Thus, there is demand for a semiconductor device that can effectively restrict inrush current and reduce switching loss and generation of resonance noise.

One aim of the present invention is to provide a semiconductor device having IGBTs that reduce switching loss and the occurrence of switching noise, and that can have excellent ON voltage and short-circuit resistance.

Another aim of the present invention is to provide a semiconductor device that can effectively restrict inrush current and reduce switching loss and the generation of switching noise and resonance noise.

Another aim of the present invention is to provide a semiconductor device that has at least one of the desirable characteristics listed above in accordance with the above-mentioned aims.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: a semiconductor layer having a trench formed therein; a field-effect transistor structure formed adjacent to the trench, the field-effect transistor structure having an emitter region and a drain region that face each other in a depth direction of the trench across a base region; a floating region formed on a side of the trench opposite to the field-effect transistor; an insulating film formed on an inner surface of the trench; and a trench gate and an emitter connecting part provided in the trench and insulated from each other in the trench, the emitter connecting part being electrically connected to the emitter region, wherein the trench gate faces the field-effect transistor structure across the insulating film, and wherein the emitter connecting part faces the floating region across the insulating film.

With this configuration, the capacitance caused by the trench contacting the floating region can be the capacitance of the junction area between the emitter connecting part and the floating region (capacitance between collector-emitter connecting part). This makes it so the trench gate is not affected by the junction with the floating region. Accordingly, it is possible to reduce switching loss more than in conventional semiconductor devices in which the floating region and the trench gate are joined together. Meanwhile, if the drain region of the FET structure that the trench gate faces is grounded together with the collector region, then changes in capacitance between the trench gate and the drain region can be stably maintained during switching. As a result, it is possible to suppress the occurrence of switching noise.

The inventions of the present application have researched a semiconductor device (hereinafter, referred to as "the semiconductor device of the reference example") having IGBTs in which a plurality of trench emitters are formed between mutually adjacent trench gates, and the trench emitters are electrically joined to the floating regions. In this structure, there is no joining region between the trench gates and the floating regions, and thus it is possible to predict an improvement in the switching loss and switching noise described above. The semiconductor device of the reference example, however, has FET structures formed in the respective areas between the trench gates and the trench emitters. Accordingly, the trench gates and the trench emitters face each other across the FET structures. This reduces the carrier storage effect caused by the FET structures being sandwiched by the trench gates, and thus leads to a reduction in carrier density in the semiconductor layer. This results in an increase in drift resistance in the drain region and a susceptibility to increases in ON voltage.

In contrast, in one aspect of the present invention described above, the trench gates can be made to face each other through the insulating film and the FET structures; therefore, it is possible to increase the carrier storage effect caused by the trench gates. This increases carrier density in the semiconductor layer, thus making it possible to reduce drift resistance in the drain region. This can help reduce ON voltage of the semiconductor device.

Furthermore, in one aspect of the present invention described above, unlike in the semiconductor device of the reference example, the trench gates and the emitter junctions are formed in the same respective trenches, and thus it is not necessary to separately form trench gates and trench emitters. Accordingly, the number of FET structures needed to be formed can be reduced. In other words, the number of contact openings needed for connecting the FET structures can be reduced. This can decrease the contact aperture ratio and make it possible to effectively suppress a decrease in short-circuit resistance of the semiconductor device.

In the above-mentioned semiconductor device, the trench gate may be formed adjacent to a side face of the trench in a cross-section perpendicular to a lengthwise direction of the trench, the emitter connecting part may be formed adjacent to another side face of the trench in the cross-section perpendicular to the lengthwise direction of the trench, and the semiconductor device further may include a center insulating film interposed between the trench gate and the emitter connecting part.

In the above-mentioned semiconductor device, the trench gate and the emitter connecting part may be formed in a film shape along respective side faces of the trench The above-mentioned semiconductor device may further include a gate contact trench formed in the semiconductor layer and continuing from a side face of the trench adjacent to the trench gate; and an emitter contact trench formed in the semiconductor layer and continuing from a side face of the trench adjacent to the emitter connecting part, and the gate contact trench and the emitter contact trench may have a width that is narrower than the trench.

With this configuration, in order to obtain a configuration in which the respective junctions are adjacent to one or the other side of the trench, the electrode material for the trench gate and the emitter connecting part is deposited along the inner surface of the trench, and at this time the electrode material deposited on one or the other side face is integrated inside a gate contact trench or an emitter contact trench that have smaller widths than the trench. This makes it possible to completely fill the gate contact trench and the emitter contact trench with this electrode material. Thus, the area of the electrode material when seen from above the thickness direction of the respective contact trenches is equal to at least the diameter (width) of the respective contact trenches, which allows for contact to be made with ease.

In the above-mentioned semiconductor device, the trench may be formed in a loop that defines an inner area where the floating region is disposed and an outer area where the field-effect transistor structure is disposed, the gate contact trench may be drawn out from the looped trench to the outer area, and the emitter contact trench may be drawn out from the looped trench to the inner area.

In the above-mentioned semiconductor device, the field-effect transistor structure may be provided in a plurality in stripe shapes as seen in a plan view from a direction normal to a surface of the semiconductor layer, the looped trench may be disposed in an area between the adjacent field-effect transistor structures, the gate contact trench of the looped trench provided in this area may be drawn outward from an end of the looped trench in a lengthwise direction of the stripe shape, the emitter contact trench of the looped trench provided in this area may be drawn inward from the end of the looped trench in the lengthwise direction of the stripe shape, the gate contact trench and the emitter contact trench being drawn in opposite directions to each other, and the semiconductor device may further include: a gate finger formed so as to go across the gate contact trench around an active area where the stripe-shaped field-effect transistor is formed, the gate finger being electrically connected to the trench gate; and an emitter electrode formed so as to cover the emitter contact trench above the active area and at a gap from the gate finger, the emitter electrode being electrically connected to the emitter connecting part.

In the above-mentioned semiconductor device, the floating region may be formed so as to partially wrap around a bottom of the trench.

With this configuration, the floating region is formed so as to partially wrap around the bottom of the trench; therefore, it is possible to alleviate collector-emitter voltage from burdening the trench during switching OFF operations. Thus, it is possible to suppress device failure due to sudden changes in voltage (dv/dt). This allows for the short-circuit resistance of the semiconductor device to be maintained. Furthermore, the short-circuit resistance can be improved by the floating region being deeper than the base region, and the base region can be made shallow; therefore, it is possible to shorten the channel length by appropriately designing the depth of the base region, thereby suppressing a rise in ON voltage.

The above-mentioned semiconductor device may further include a second trench formed in the semiconductor layer, the second trench reaching at least the floating region; and a second emitter connecting part disposed in the second trench across an insulating film, the second emitter connecting part being electrically connected to the emitter region.

In the above-mentioned semiconductor device, the floating region may be formed at a same depth as the base region, and the second trench may be formed so as to penetrate the floating region.

In the above-mentioned semiconductor device, the second trench may be formed at a same width as the trench, and the second emitter connecting part may further include a pair of connectors that are insulated from each other in the second trench.

With this configuration, the second trench can be formed in the same step in which the trench is formed by merely changing the layout of the mask. Furthermore, the second trench is formed having the same width as the trench, thereby making it possible to form the second emitter connecting part in the same step in which the trench gate and the emitter connecting part are formed. This results in being able to form the second trench and the second emitter connecting part without complicating the manufacturing process.

In the above-mentioned semiconductor device, the second trench may be formed at a width that is less than the trench, and the second emitter connecting part may be embedded as one integral member in the second trench.

Even with this configuration, the second emitter connecting part can be formed in the same step in which the trench gate and the emitter connecting part are formed.

In another aspect, the present disclosure provides a semiconductor device, including: a semiconductor layer having an active area in which a plurality metal-insulated-semiconductor gate structures are arrayed; a surface gate metal that is disposed on the semiconductor layer and that has a pad section for receiving external power, and a wiring section extending around the active area and electrically connected to respective gates of the plurality of metal-insulated-semiconductor gate structures, the surface gate metal having a removal area for isolating at least a portion of the pad section and the wiring section; and lead out wiring that is lead out from the pad section to the adjacent wiring section across the removal section, the lead out wiring being made of a material that has a higher resistance than the gate metal.

In the semiconductor device of the other aspect of the present invention described above, current flows through lead out wiring when flowing from the pad section to the wiring section; therefore, it is possible to restrict current flowing into the wiring section caused by surface current. This makes it possible to suppress inrush current (di/dt) locally flowing to the gate of the MIS gate structures positioned close to the pad section, thereby suppressing a situation in which the MIS gate structures turn ON locally. As a result, it is possible to suppress variation in the applied current between the plurality of MIS gate structures regardless of distance from the pad section. Furthermore, because it is possible to suppress the MIS gate structures from turning ON locally, it is also possible to suppress the switching of the MIS gate structures triggering resonance noise. Therefore, it is possible to reduce switching loss caused by resonance noise during switching ON.

In a configuration of the aspect of the present invention described above, the removal area may be formed so as to surround the pad section.

In this case, surface current can be restricted in a location that is near the pad section, thereby making it possible to effectively suppress local current flowing to the MIS gate structures near the pad section.

The wiring section may further include a line-shaped gate finger that extends so as to surround the active area. With this configuration, the current of the surface current that has been restricted will flow to the gate finger, and thus it is possible to suppress variation in current along the lengthwise direction of the gate finger.

The wiring section may further include a pad peripheral section integrally formed with the gate finger and that surrounds the removal area that surrounds the pad section. With this configuration, it is possible to suppress current flowing to the gate of the MIS gate structures without the going through the gate finger.

In the semiconductor device of the other aspect of the present invention described above, the plurality of the metal-insulated-semiconductor gate structures may be formed in a stripe shape as seen in a plan view from a direction normal to a surface of the semiconductor layer, the gate finger may be disposed so as to go across the stripe-shaped metal-insulated-semiconductor gate structures, and the gate finger may contact the gates of the metal-insulated-semiconductor gate structures on both lengthwise ends of the respective metal-insulated-semiconductor gate structures.

The pad section may be formed in a center of an area along the stripe direction of the metal-insulated-semiconductor gate structures, and the gate finger may extend along both sides along the stripe direction from the pad section and go across the stripe-shaped metal-insulated-semiconductor gate structures.

In this configuration, the gate finger contacts the gate of the MIS gate structures at a position that is relatively far from the pad section, thereby making it possible to restrict inrush current.

The semiconductor layer may be formed in a equilateral shape in a plan view, the pad section may be formed on a corner of the equilateral semiconductor layer, and the gate finger may be formed integrally with the pad section and further include a first gate finger disposed so as to extend along the stripe direction of the metal-insulated-semiconductor gate structures and a second gate finger that is separated from the pad section through the removal area and disposed so as to go across the metal-insulated-semiconductor gate structures from the pad section.

In this configuration, the first gate finger makes contact with the gate in the MIS gate structure at a position that is relatively far from the pad section, thereby making it possible to restrict inrush current. Meanwhile, the second gate finger makes contact with the gate of the MIS gate structure at a position that is relatively adjacent to the pad section, but the second gate finger is isolated from the pad section. Furthermore, the second gate finger is connected to the pad section through the lead out wiring, and thus it is possible to restrict the inrush current even if the inrush current flows to the pad section.

In the semiconductor device of the other aspect of the present invention described above, the removal area may selectively surround a portion around the pad section.

In the semiconductor device of the other aspect of the present invention described above, the removal area may completely surround an entirety of the pad section.

With this configuration, it is possible to restrict surface current on the entire area surrounding the pad section. This makes it possible to effectively suppress local current flowing to the MIS gate structures near the pad section.

In the semiconductor device of the other aspect of the present invention described above, the lead out wiring may connect the pad section and the wiring section via a bottom part of the removal area. With this configuration, it is possible to form the lead out wiring in the same step as the gates of the MIS gate structures. Therefore, it is possible to simplify the manufacturing process. Accordingly, in this case, it is preferable that the lead out wiring be made of the same material as the gates in the MIS gate structures.

The wiring section may be made of a metal material having Al as a main component thereof, and the lead out wiring and the gates of the metal-insulated-semiconductor gate structures may be made of polysilicon.

In the semiconductor device of the other aspect of the present invention described above, an insulated gate bipolar transistor having a portion of the metal-insulated-semiconductor gate structure may be formed in the semiconductor layer.

This insulated gate bipolar transistor may include a trench-gate insulated gate bipolar transistor.

The semiconductor device in one aspect of the present invention described above and the various aspects thereof can be combined with semiconductor device of another aspect of the present invention described above and the various aspects thereof to exhibit the same respective effects and to exhibit synergy effects thereof. These diverse combinations are also aspects of the present invention.

It is to be understood that both the foregoing general description and the following detailed description are exemplary and explanatory, and are intended to provide further explanation of the invention as claimed.

Below, embodiments of the present invention will be explained in detail with reference to appended drawings.

Figure 1:
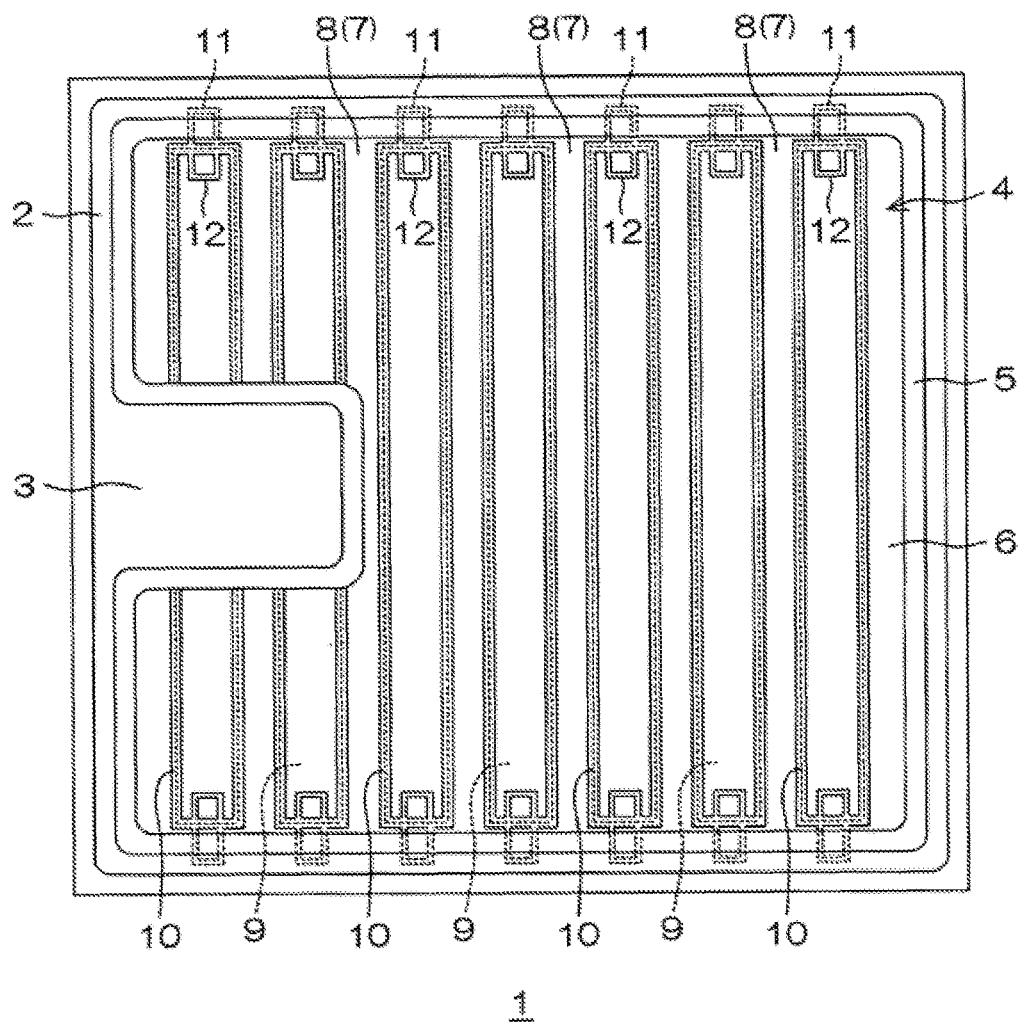
FIG. 1 is a schematic plan view of a semiconductor device according to Embodiment 1 of the present invention.

FIG. 1 is a schematic plan view of a semiconductor device 1 according to Embodiment 1 of the present invention.

The semiconductor device 1 is formed in an equilateral shape in a plan view as seen from the direction normal to the surface thereof (hereinafter, referred to as simply a "plan view"). A gate finger 2 and a gate pad 3 are formed on the periphery of this surface. In a plan view, the gate finger 2 is formed in a substantially square loop shape along the periphery of the semiconductor device 1. An active area 4 is formed on the area surrounding the gate finger 2.

The gate pad 3, which has a substantially square shape in a plan view, is disposed in the center of the lengthwise direction of gate finger 2 following one side thereof. The gate pad 3 is formed so as to integrally continue from the gate finger 2. Bonding wiring (not shown) is connected to the gate pad 3, and this supplies power to the semiconductor device 1. The gate finger 2 and the gate pad 3 are made of a metal material having Al as the main component thereof, for example. In the present embodiment, an example is described in which the gate pad 3 is disposed in the center of the lengthwise direction of an area along one side of the semiconductor device 1, but the gate pad 3 may be formed on one corner of the gate finger 2.

A removal area 5 for preventing the gate finger 2 and the gate pad 3 from contacting an emitter electrode 6 is formed in an area surrounded by the gate finger 2 and the gate pad 3. The removal area 5 is formed in a loop shape in a plan view along the gate finger 2 and the gate pad 3. The emitter electrode 6 has a portion thereof selectively formed in a recessed equilateral shape in a plan view so as to cover the area surrounded by the removal area 5. The gate pad 3 is disposed in the recessed area of the emitter electrode 6. The emitter electrode 6 is formed of the same metal material as the gate finger 2 and the gate pad 3, for example.

A plurality of FET structures 8 constituting singe cells of IGBTs (insulated gate bipolar transistors) are formed in the active area 4 in a stripe shape. Areas having a uniform width are disposed between the respective FET structures 8, and a looped trench 10 is formed in each of these areas. Thus, the FET structures 8 and the looped trenches 10 are alternately formed in the active area 4.

The looped trenches 10 have a closed curve structure formed in a rectangular loop shape, with the long side thereof being along the direction of the stripes. A p-type floating region 9 (the area shown by the dotted line in FIG. 1) is formed inside each of the areas surrounded by the looped trenches 10.

The shape of the looped trenches is not limited to a rectangular loop shape in a plan view, and any shape may be used as long as the shape forms a loop. The looped trenches 10 may have an elliptical shape in a plan view, for example.

A gate contact trench 11 and an emitter contact trench 12 are respectively formed on every lengthwise end of the looped trenches 10. The gate contact trenches 11 and the emitter contact trenches 12 are drawn out inside and outside the looped trenches 10 so as to face each other from the respective ends thereof.

The gate contact trenches 11 and the emitter contact trenches 12 are all formed in a bridge-like shape that integrally continues from the respective looped trenches 10 in a plan view. More specifically, the gate contact trenches 11 and the emitter contact trenches 12 are all formed in a bridge-like shape on the short sides of the looped trenches 10 (in the present embodiment, this bridge-like shape is an angular bridge-like shape that includes a pair of columns facing each other and a support part that joins this pair of columns). The gate finger 2 is disposed so as to go across the gate contact trenches 11 formed on the respective looped trenches 10 (specifically, to cover the support part of the gate contact trenches 11).

Figure 2A:
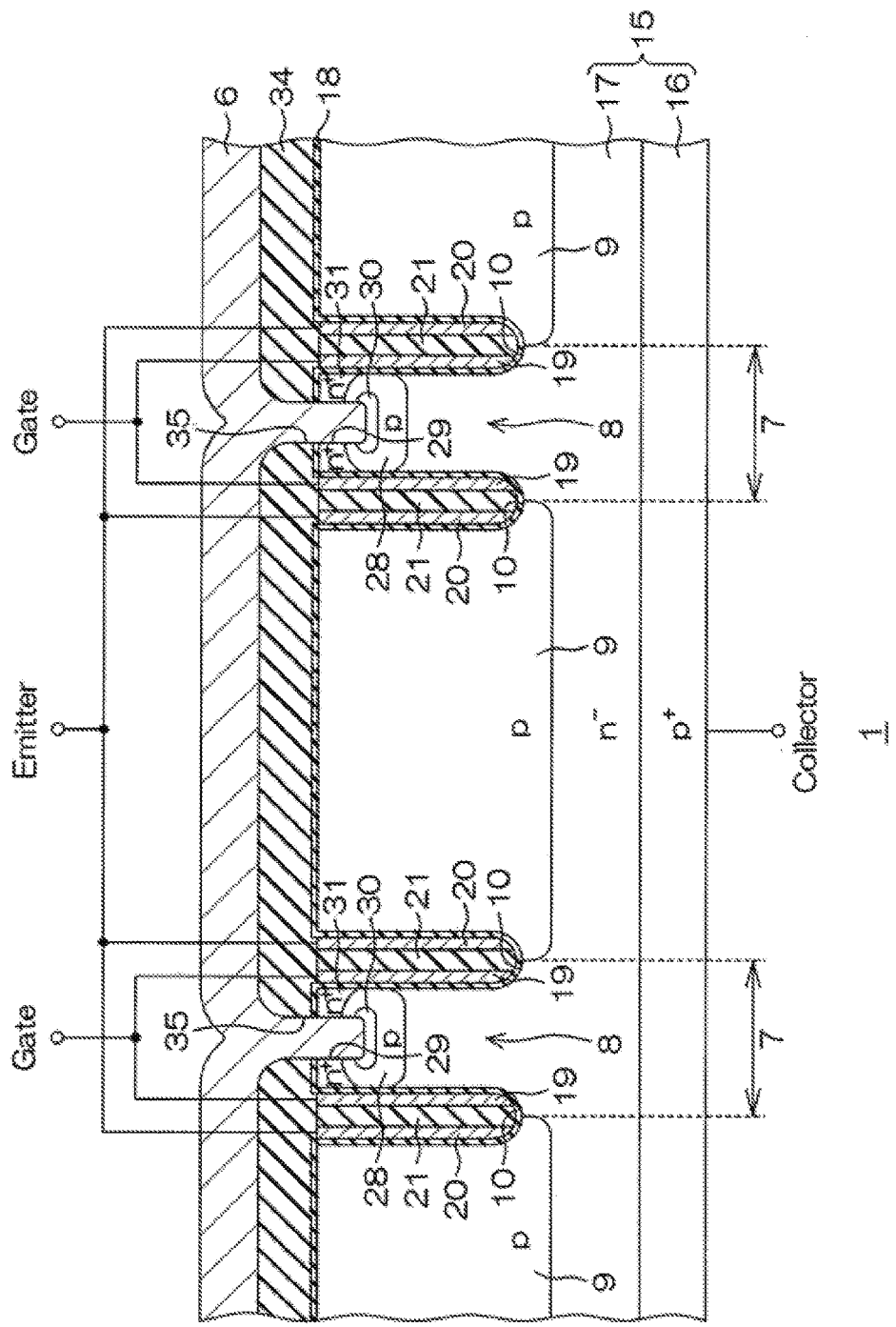
FIG. 2A is a schematic cross-sectional view of the semiconductor device in FIG. 1.
Figure 2B:
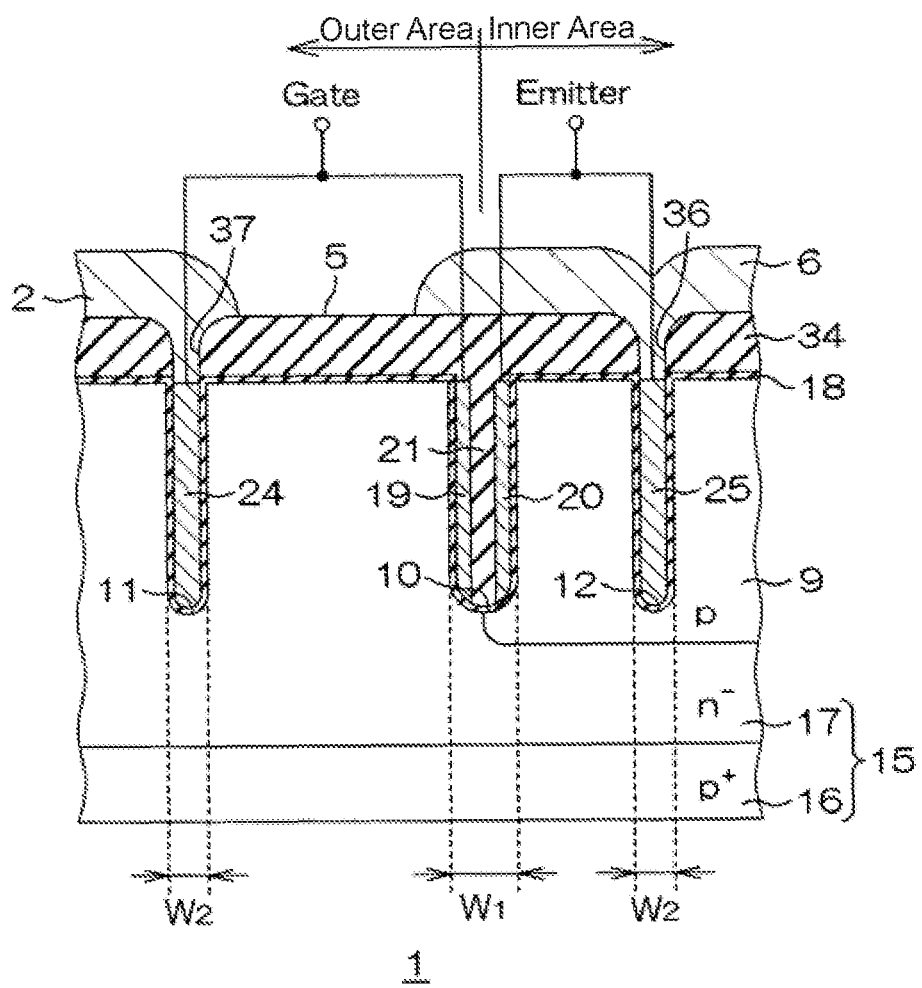
FIG. 2B is a schematic cross-sectional view of a portion of trenches in the semiconductor device shown in FIG. 1.

Next, a cross-sectional view of the semiconductor device 1 will be explained with reference to FIGS. 2A and 2B. FIG. 2A is a schematic cross-sectional view of the semiconductor device 1 in FIG. 1. FIG. 2B is a schematic cross-sectional view of one end of the looped trench 10 of the semiconductor device 1 shown in FIG. 1. FIG. 2A is a cross-sectional view of when the semiconductor device 1 has been cut in a direction perpendicular to the stripes of the looped trenches 10. FIG. 2B is a cross-sectional view of when the semiconductor device 1 has been cut in a direction going across the short sides of the looped trenches 10, the gate contact trenches 11, and the emitter contact trenches 12.

As shown in FIGS. 2A and 2B, the semiconductor device 1 has a semiconductor substrate 15, which is one example of a semiconductor layer of the present invention. The semiconductor substrate 15 is an n⁻ silicon substrate, for example, and is formed of a p⁺ collector region 16 and an n⁻ drain region 17 in this order from the rear surface side thereof. The p⁺collector region 16 is formed on the entire rear surface of the semiconductor substrate 15, and the n⁻ drain region 17 is formed on the entire front surface of the semiconductor substrate 15.

The dopant concentration of the p⁺ collector region 16 is $1 \times 10^{15}$ cm⁻³ to $2 \times 10^{19}$ cm⁻³, for example. The p-type dopant can be B (boron), Al (aluminum), or the like, for example (the same for hereinafter). The dopant concentration of the n⁻ drain region 17 is $1 \times 10^{15}$ cm⁻³ to $5 \times 10^{17}$ cm⁻³, for example. The n-type dopant can be N (nitrogen), P (phosphorous), As (arsenic), or the like, for example (the same for hereinafter).

The looped trenches 10 are dug in the thickness direction of the surface of the semiconductor substrate 15. The looped trenches 10 are formed with a uniform width. The side faces of the looped trenches 10 are substantially perpendicular to the surface of the semiconductor substrate 15. The bottoms of the looped trenches 10 are formed so as to be rounded from the side faces of the looped trenches 10. The p-type floating regions 9 are formed in the area demarcated by the looped trenches 10.

The p-type floating regions 9 are semiconductor areas that are electrically floating. In the present embodiment, the p-type floating region 9 is formed such that the boundary thereof is below the looped trenches 10, and the bottom of the p-type floating region 9 is deeper than the bottom of the looped trenches 10. Specifically, the outer edge of the bottom of the p-type floating region 9 is below a center insulating film 21, which will be described later. Due to this, the p-type floating region 9 is formed under an emitter connecting part 20, which is described later, but not under the trench gates 19. The dopant concentration of the p-type floating region 9 is $5 \times 10^{15}$ cm⁻³ to $1 \times 10^{18}$ cm⁻³, for example.

The FET structure 8 (the single cell 7) is formed in the area between the adjacent looped trenches 10 (the outer area of the looped trenches 10). Each of the FET structures 8 includes n⁺ emitter regions 31 and the n⁻ drain region 17, which face each other across a p-type base region 28 in the depth direction of the looped trenches 10.

The p-type base region 28 is shared by the adjacent looped trenches 10 that are closest to each other. In the present embodiment, the interface of the p-type base region 28 and the n⁻ drain region 17 is configured to be the center in the depth direction of the looped trenches 10 or above this center, and the p-type base regions 28 are diffused relatively shallowly on the semiconductor substrate 15. The dopant concentration of the p-type base region 28 is $1 \times 10^{16}$ cm⁻³ to $1 \times 10^{18}$ cm⁻³, for example.

Contact trenches 29 that are dug from the surface of the semiconductor substrate 15 are formed in the p-type base layer 28. The contact trenches 29 have a uniform width along the lengthwise direction of the looped trenches 10. A p⁺ base contact region 30 is formed at the bottom of each of the contact trenches 29. The dopant concentration of the p⁺ base contact region 30 is $5 \times 10^{18}$ cm⁻³ to $1 \times 10^{20}$ cm⁻³, for example.

The n⁺ emitter regions 31 are formed between the contact trench 29 and the respective looped trenches 10 on the surface of each of the p-type base regions 28. Each side of the contact trench 29 has one of n⁺ emitter regions 31, and each of these n⁺ emitter regions 31 is exposed to the respective side faces of the contact trench 29. The dopant concentration of the n⁺ emitter region 31 is $1 \times 10^{19}$ cm⁻³ to $5 \times 10^{20}$ cm⁻³, for example.

As shown in FIGS. 2A and 2B, an insulating film 18 made of a silicon oxide film, for example, is formed on the inner surface (side faces and bottom) of the semiconductor substrate 15 and the respective looped trenches 10. The trench gates 19 and the emitter connecting parts 20 are formed on the inner side of the insulating film 18 in the looped trenches 10. The trench gates 19 and the emitter connecting parts 20 are formed in the looped trenches 10 with gaps therebetween and are insulated from each other. More specifically, the trench gates 19 and the emitter connecting parts 20 are formed in a film-like shape along the inner side faces and the outer side faces of the looped trenches 10 in the cross section shown in FIGS. 2A and 2B. Due to this, there is a space defined by the respective rear surfaces of the trench gates 19 and the emitter connecting parts 20 (the surface opposite to the surface in contact with the looped trench 10) in the center of the width direction of the looped trenches 10. This space is completely filled by the center insulating film 21 up to the opening end of the looped trench 10, which insulates the trench gate 19 from the emitter connecting part 20.

The trench gate 19 is formed in a substantially looped square shape in a plan view so as to surround the emitter connecting part 20. In other words, the trench gate 19 is formed on the outer area side of the looped trench 10 and forms a portion of the FET structure 8 through the insulating film 18. The trench gate 19 is made of an electrode material such as polysilicon, for example.

The emitter connecting part 20 is formed in a substantially looped square shape in a plan view on the inner area side of the looped trench 10. In other words, the emitter connecting part 20 is joined with the p-type floating region 9 through the insulating film 18. The emitter connecting part 20 is made of the same material as the trench gate 19.

As shown in FIG. 2B, the gate contact trench 11 and the emitter contact trench 12 are formed on the lengthwise end of the looped trench 10 at a width $W_2$ that is narrower than a width $W_1$ of the looped trench 10. The width $W_1$ of the looped trench 10 is 5 µm to 3.0 µm, for example, whereas the width $W_2$ of the gate contact trench 11 and the emitter contact trench 12 is 0.7 µm to 1.2 µm, for example. The gate contact trench 11 and the emitter contact trench 12 may be formed at differing widths from each other within this numerical range.

The insulating film 18 is formed in a similar manner to the looped trenches 10 on the inner surface of the respective contact trenches 11 and 12. An embedded gate electrode 24 is formed through the insulating film 18 in the gate contact trench 11. The embedded gate electrode 24 is formed so as to integrally continue from the trench gate 19 formed in the looped trench 10. An embedded emitter electrode 25 is formed through the insulating film 18 in the emitter contact trench 12. The embedded emitter electrode 25 is formed so as to integrally continue from the emitter connecting part 20 formed in the looped trench 10.

The respective contact trenches 11 and 12 are completely filled by the embedded electrodes 24 and 25, and thus the area of polysilicon (electrode material) when the respective contact trenches 11 and 12 are viewed from a depth direction thereof is equal to at least the diameter (width) of the respective contact trenches 11 and 12. As a result, it is possible to contact the respective embedded electrodes 24 and 25 with ease.

As shown in FIGS. 2A and 2B, an interlayer film 34 is stacked on the surface of the semiconductor substrate 15. Contact holes 35 that integrally continue from the contact trenches 29 are formed in the interlayer film 34. As shown in FIG. 2B, an emitter contact hole 36 that selectively exposes the embedded emitter electrode 25, and a gate contact hole 37 that selectively exposes the embedded gate electrode 24 are formed in the interlayer film 34. The interlayer film 34 is an insulating material made of tetraethyl orthosilicate (TEOS), boron phosphorous silicate glass (BPSG), silicon oxide ($SiO_2$), or the like, for example.

The emitter electrode 6, the gate finger 2, and the gate pad 3 (see FIG. 1) are formed on the interlayer film 34.

The emitter electrode 6 enters the contact trenches 29 through the contact holes 35 and is connected to the $n^+$ emitter regions 31 on the side faces of the contact trenches 29. The emitter electrode 6 is connected to the p-type base regions 28 through the $p^+$ base contact regions 30 at the bottom of the contact trenches 29.

The emitter electrode 6 also enters the emitter contact holes 36 and is connected to the embedded emitter electrodes 25. Due to this, the power from the emitter electrode 6 is supplied to the emitter connecting parts 20 through the embedded emitter electrodes 25.

The gate finger 2 enters the gate contact holes 37 and is connected to the embedded gate electrodes 24. Due to this, the power from the gate finger 2 (gate pad 3) is supplied to the trench gates 19 through the embedded gate electrodes 24.

As described above and shown in FIG. 2A, with the semiconductor device 1, the p-type floating regions 9 are disposed in the inner area of the looped trenches 10, and thus, the emitter connecting parts 20 formed in the inner area of the looped trenches 10 face the respective p-floating regions 9. The trench gates 19 formed on the outer area side of the looped trenches 10 are separated from the p-type floating regions 9 via the emitter connecting parts 20 and the center insulating films 21. Therefore, the capacitance formed by the looped trenches 10 contacting the p-type floating region 9 can be capacitance between the collector emitter connecting parts. The trench gates 19, however, are not in contact with the p-type floating regions 9, and thus can be prevented from being affected by the capacitance from the trench gates 19 joining with the p-type floating regions 9. As a result, it is possible to effectively reduce switching loss.

The $n^-$ drain region 17, which the trench gates 19 face across the insulating film 18, is grounded with the $p^+$ collector region 16. Therefore, the change in capacitance between the trench gates 19 and the $n^-$ drain region 17 during switching will be stable, and thus less susceptible to noise generation. As a result, it is possible to reduce noise generation during switching.

Figure 3:
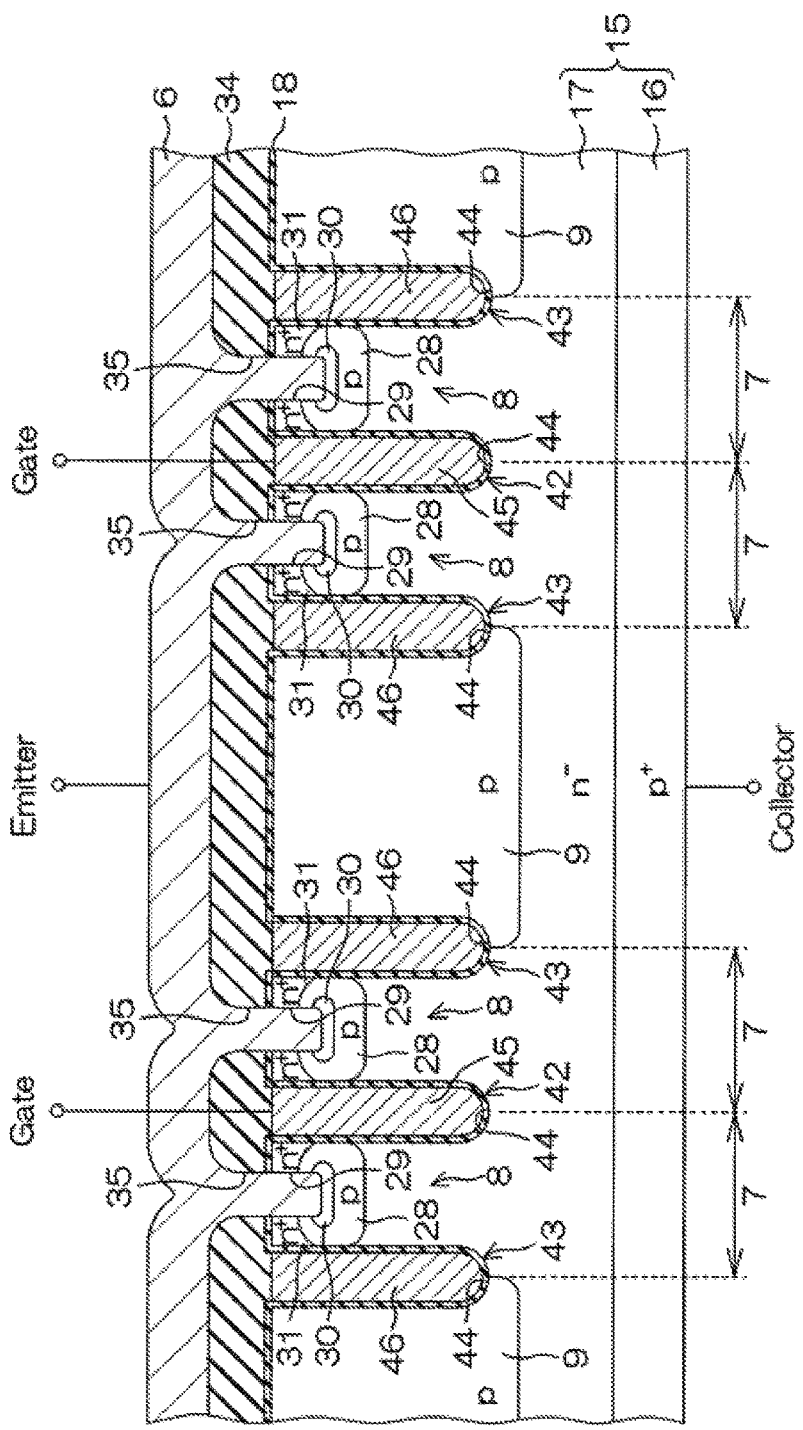
FIG. 3 is a schematic cross-sectional view of a semiconductor device according to a reference example.
Figure 4:
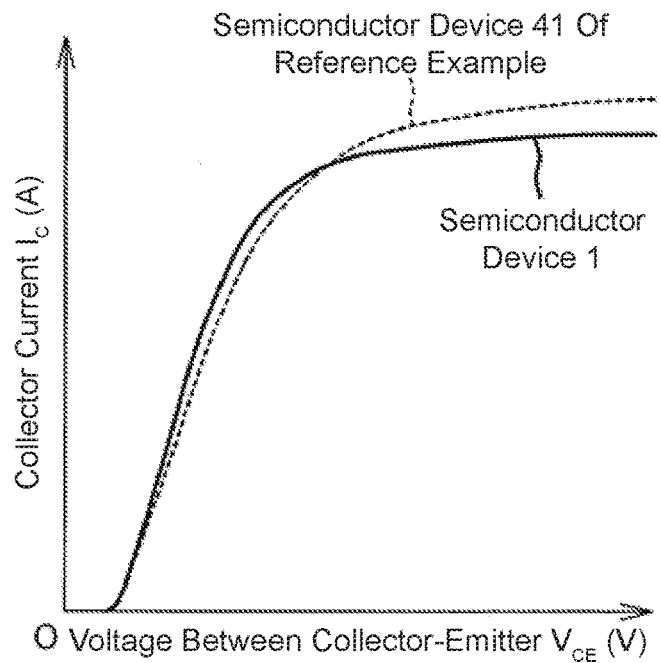
FIG. 4 is a graph comparing steady loss in the semiconductor device shown in FIG. 1 and the semiconductor device of the reference example.
Figure 5:
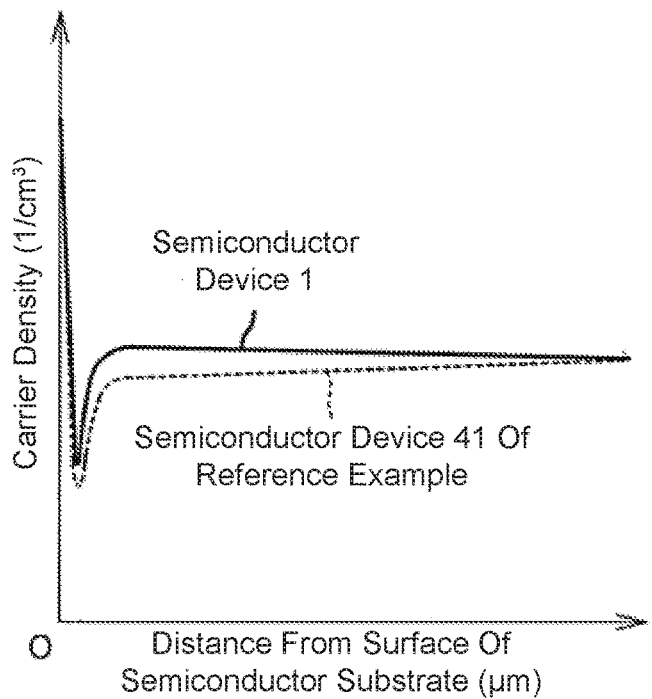
FIG. 5 is a graph comparing carrier density in the semiconductor device shown in FIG. 1 and the semiconductor device of the reference example.

When the characteristics of the semiconductor device 1 and the characteristics of a semiconductor device 41 according to the reference example shown in FIG. 3 were investigated, the graph shown in FIG. 4 and the graph shown in FIG. 5 were obtained. Hereinafter, the configuration of the semiconductor device 41 according to the reference example of FIG. 3 will be explained, and then the characteristics of the semiconductor device 1 will be explained with reference to FIGS. 3 to 5.

FIG. 3 is a schematic cross-sectional view of the semiconductor device 41 of the reference example. In FIG. 3, portions corresponding to the portions in FIG. 2A are assigned the same reference characters and descriptions thereof will be omitted.

The semiconductor device 41 according to the reference example has IGBTs with a structure in which a plurality of trench emitters 43 are formed between mutually adjacent trench gates 42, and the trench emitters 43 are joined with p-type floating regions 9. In FIG. 3, an example is shown in which two trench emitters 43 are formed between the mutually adjacent trench gates 42.

The trench gates 42 include gate electrodes 45 embedded in trenches 44 through an insulating film 18, and the trench emitters 43 include emitter electrodes 46 that are embedded in the trenches 44 through the insulating film 18. FET structures 8 are formed in the areas between the trench gates 42 and the trench emitters 43. In other words, in the semiconductor device 41 according to the reference example, there is no joining region of the trench gates 42 and the p-type floating regions 9, and contact trenches 29 and contact holes 35 are formed in accordance with the areas where the respective FET structures 8 are formed.

FIG. 4 is a graph for explaining the respective steady losses of the semiconductor device 1 shown in FIG. 1 and the semiconductor device 41 shown in the reference example. FIG. 5 is a graph for explaining the respective carrier densities of the semiconductor device 1 shown in FIG. 1 and the semiconductor device 41 shown in the reference example.

The graph in FIG. 4 shows the relationship between collector current $I_C$ (A) and voltage $V_{CE}$ (V) between collector emitters, and the graph in FIG. 5 shows the relationship between carrier density (1/cm$^{-3}$) and the distance (μm) from the surface of the semiconductor substrate 15. In the respective graphs in FIGS. 4 and 5, the characteristics of the semiconductor device 1 are shown with a solid line, and the characteristics of the semiconductor device 41 according to the reference example are shown with a dotted line.

As shown in FIG. 4, it can be confirmed that the collector current $I_C$ of the semiconductor device 41 according to the reference example has a smooth ascent from start to saturation and reaches saturation while the voltage $V_{CE}$ between the collector emitters is relatively highly.

In contrast to this, the collector current $I_C$ of the semiconductor device 1 has a steep ascent from start to saturation and reaches saturation while the voltage $V_{CE}$ between the collector emitters is relatively low.

It can also be confirmed that the ON voltage of the semiconductor device 1 is lower than the ON voltage of the semiconductor device 41 according to the reference example. Accordingly, the steady loss of the semiconductor device 1 can be said to be lower than the steady loss of the semiconductor device 41 according to the reference example. ON voltage is defined as the voltage $V_{CE}$ between collector emitters required to push the rated current while the voltage necessary for the ON state is applied between the gate emitters (while $V_{GE}$ is applied).

Next, as shown in FIG. 5, if the carrier density of the semiconductor device 1 is compared to the carrier density of the semiconductor device 41 in the reference example, it is understood that the semiconductor device 1 has a higher carrier density than the semiconductor device 41 of the reference example from the surface of the semiconductor substrate 15 to the rear surface thereof.

As shown in FIG. 3, according to the configuration of the semiconductor device 41 of the reference example, there is no joining region between the trench gates 42 and the p-type floating regions 9, and thus the trench gates 42 are not affected by the capacitance between the collector trench gates, and it is possible to improve the problems of switching loss and switching noise. With this type of configuration, however, the FET structures 8 are sandwiched by the trench gates 42 and the trench emitters 43, and not sandwiched by only the adjacent trench gates 42. Therefore, the carrier storage effect from the trench gates 42 is reduced, and as shown in FIG. 5, this reduces the carrier density in the semiconductor substrate 15, thus increasing drift resistance in the n$^-$ drain region 17. As a result, as shown in FIG. 4, the ON voltage of the IGBTs becomes comparatively higher.

In contrast, as shown in FIG. 2A, the configuration of the semiconductor device 1 has the FET structures 8 sandwiched by the adjacent trench gates 19, thus making it possible to increase the carrier storage effect from the trench gates 19. As shown in FIG. 5, this increases the carrier density in the semiconductor substrate 15, which allows for the drift resistance in the n$^-$ drain region 17 to be reduced. As shown in FIG. 4, this enables a reduction in ON voltage of the IGBTs.

Although not shown, when the amount of noise switching that occurs in the respective structures of the semiconductor device 1 and the semiconductor device 41 of the reference example was tested through simulation, it was found that the noise in the semiconductor device 1 was markedly lower than the semiconductor device 41 according to the reference example.

Furthermore, with the configuration of the semiconductor device 1, unlike in the semiconductor device 41 of the reference example, the trench gate 19 and the emitter connecting part 20 are provided in the same looped trench 10, and thus it is not necessary to form the trench gates 42 and the trench emitters 43. Accordingly, the number of FET structures 8 needed to be formed can be reduced. In other words, the number of contact trenches 29 (contact holes 35) needed to connect with the FET structures 8 can be reduced. This makes it possible to reduce the contact aperture ratio and to effectively suppress a reduction in short-circuit resistance of the IGBTs.

Next, the manufacturing process for the semiconductor device 1 will be described with reference to FIGS. 6A to 6K. FIGS. 6A to 6K are cross-sectional views for explaining one example of the manufacturing process of the semiconductor device 1 in FIG. 1. FIGS. 6A to 6K respectively correspond to FIG. 2A.

Figure 6A:
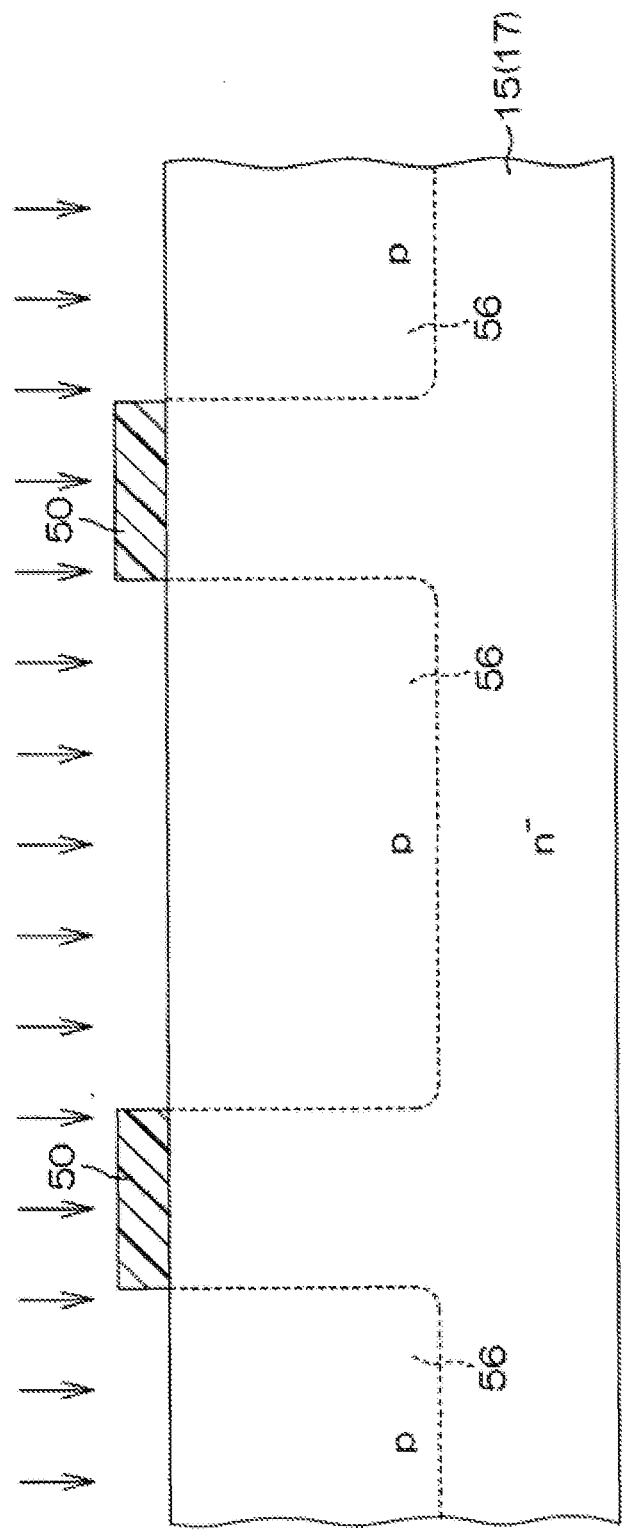
FIG. 6A is a cross-sectional view for explaining one example of a manufacturing step for the semiconductor device in FIG. 1.

In order to manufacture the semiconductor device 1, first, as shown in FIG. 6A, the semiconductor substrate 15, which does not yet have the p$^+$ collector region 16 formed on the rear surface side thereof, is prepared. Next, an ion implantation mask 50 having openings therein is selectively formed on the semiconductor substrate 15 on areas where the p-type floating regions 9 will be formed. The p-type dopant is implanted into the semiconductor substrate 15 through this ion implantation mask 50. This forms ion implantation regions 56. After the ion implantation regions 56 are formed, the ion implantation mask 50 is removed.

Figure 6B:
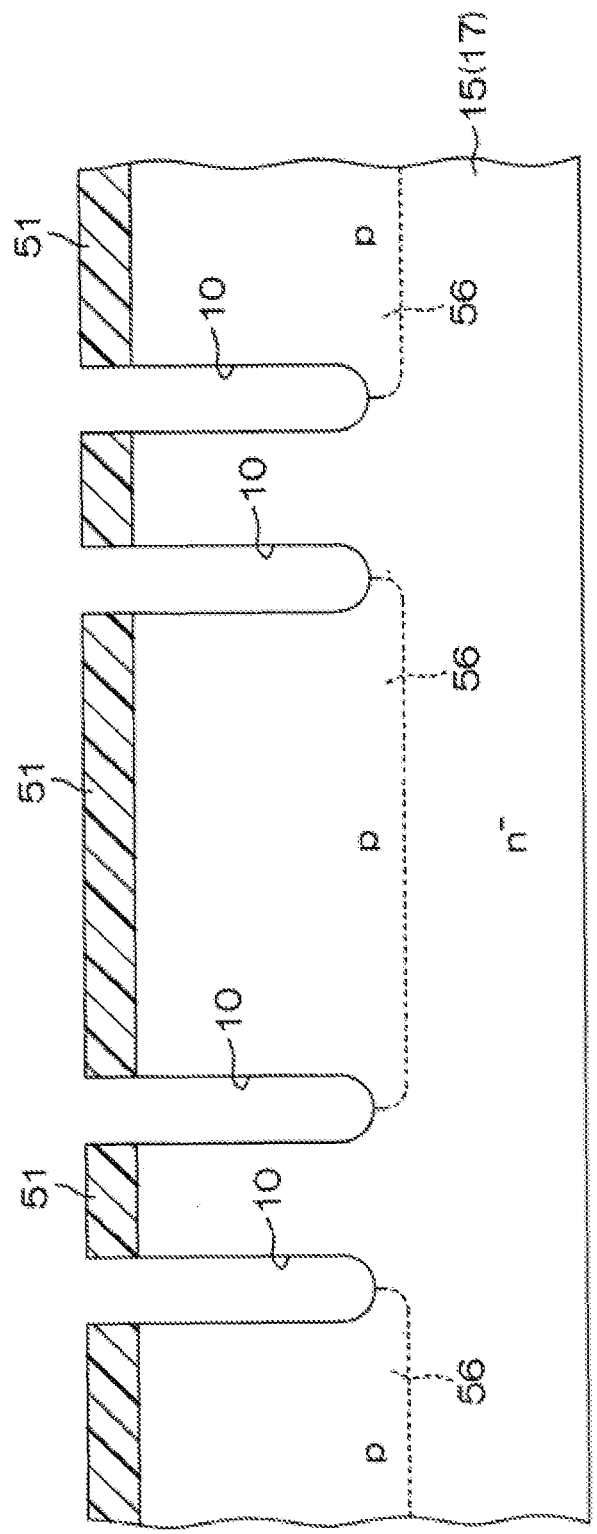
FIG. 6B is a view of the next manufacturing step after FIG. 6A.

Next, as shown in FIG. 6B, a hard mask 51 having openings therein is selectively formed on the semiconductor substrate 15 on areas where the looped trenches 10, the gate contact trenches 11, and the emitter contact trenches 12 (see FIG. 2B) will be formed. The semiconductor substrate 15 is etched through this hard mask 51 to simultaneously form the trenches 10, 11, and 12. After the trenches 10, 11, and 12 are formed, the hard mask 51 is removed.

Figure 6C:
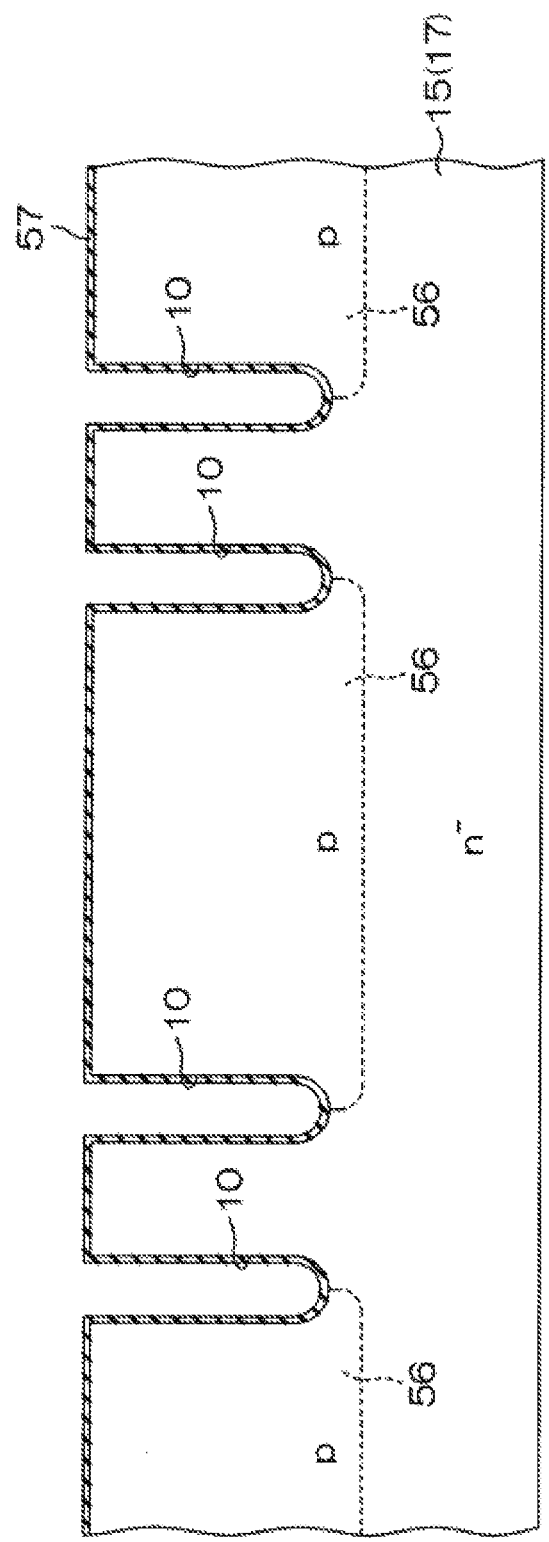
FIG. 6C is a view of the next manufacturing step after FIG. 6B.

Next, as shown in FIG. 6C, the surface of the semiconductor substrate 15 undergoes a thermal oxidation treatment. This forms a sacrificial oxide film 57 constituted of a silicon oxide film on the surface of the semiconductor substrate 15, including the inner surfaces (bottom and side faces) of the respective trenches 10, 11, and 12.

Figure 6D:
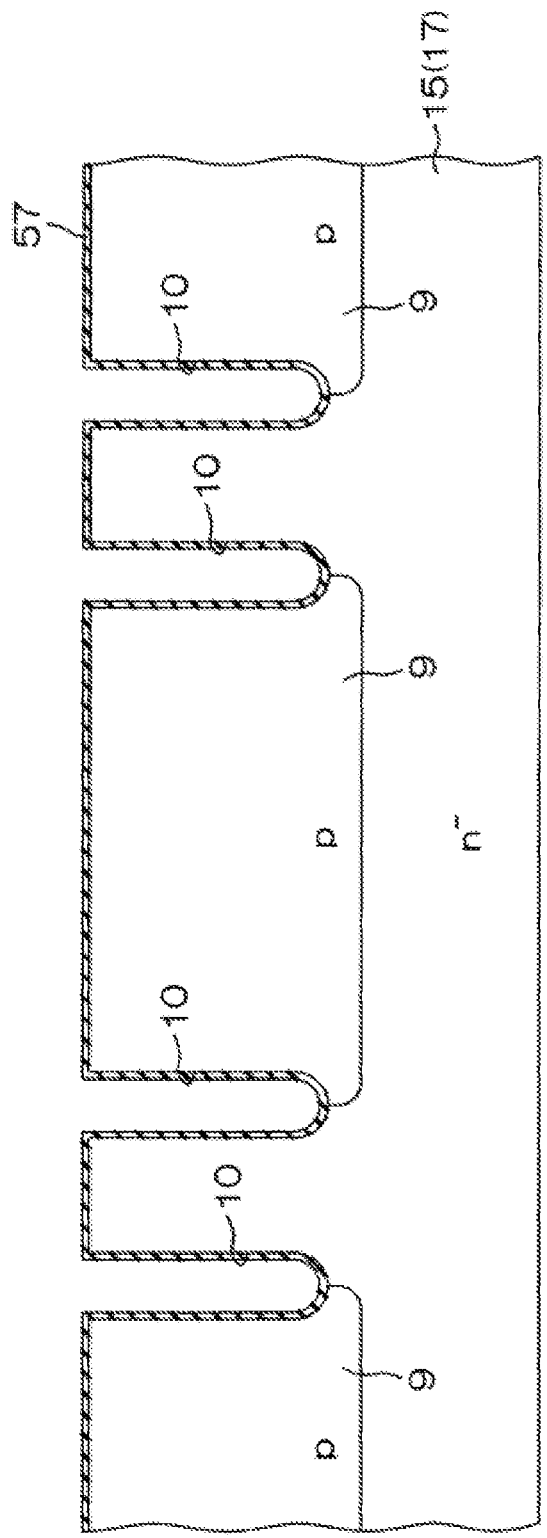
FIG. 6D is a view of the next manufacturing step after FIG. 6C.

Next, as shown in FIG. 6D, an annealing treatment is performed on the semiconductor substrate 15 covered by the sacrificial oxide film 57, thereby diffusing the p-type dopant inside the ion implantation regions 56 (drive-in diffusion). This annealing treatment is performed such that the p-type dopant reaches the bottom of the looped trenches 10. At this time, the sacrificial oxide film 57 is already formed on the inner surfaces of the looped trenches 10 before the drive-in diffusion process, thus making it possible to prevent ions escaping from the inner surfaces. This allows for the p-type dopant to be efficiently diffused, thereby forming p-type floating regions 9 that partially wrap around the bottom of the looped trenches 10.

Figure 6E:
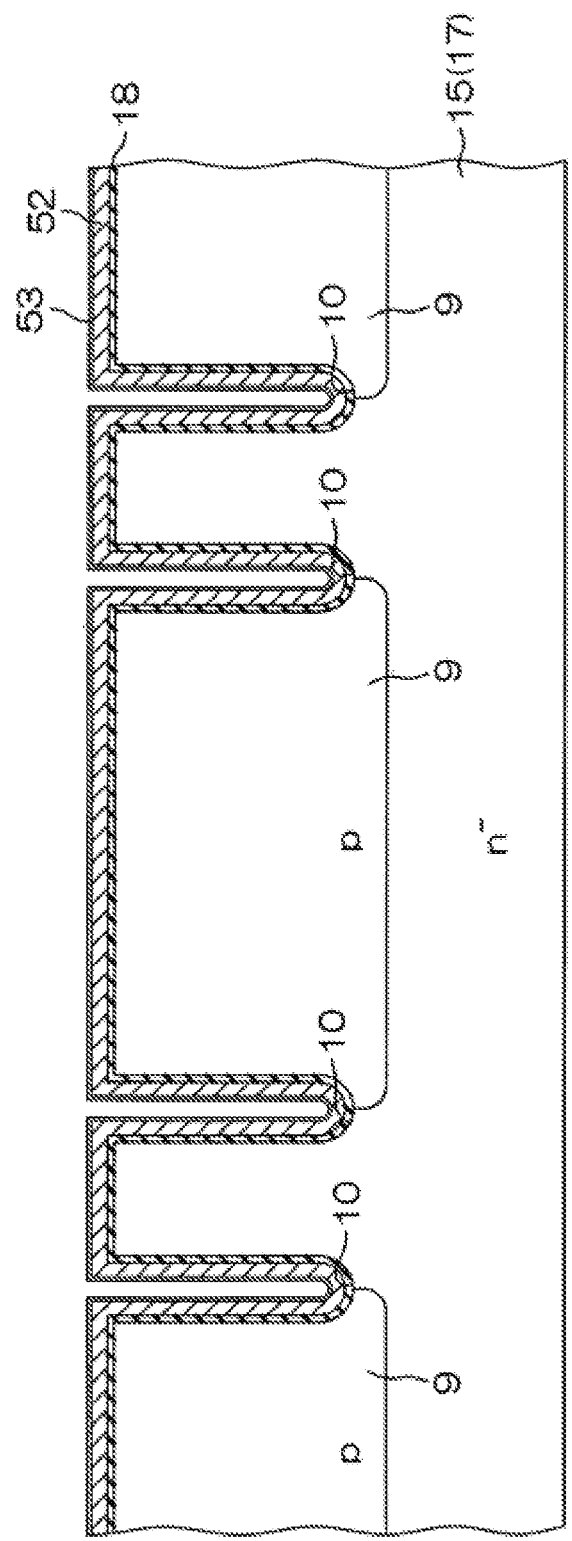
FIG. 6E is a view of the next manufacturing step after FIG. 6D.

Next, as shown in FIG. 6E, the sacrificial oxide film 57 is removed and the insulating film 18 is formed on the surface of the semiconductor substrate 15 through a thermal oxidation treatment. Next, CVD (chemical vapor deposition), for example, is used to deposit polysilicon on the surface of the semiconductor substrate 15 to form a polysilicon deposition layer 52. The width $W_2$ of the gate contact trenches 11 and the emitter contact trenches 12 is less than the width $W_1$ of the looped trenches 10 ($W_2 < W_1$, see FIG. 2B). Therefore, as shown in FIG. 6E, the looped trenches 10 of the width $W_1$ have the polysilicon deposition layer 52 formed along the inner surface thereof, and the respective contact trenches 11 and 12 have the polysilicon deposition layer 52 deposited on both inner side faces thereof. As shown in FIG. 2B, it is possible to completely fill the respective contact trenches 11 and 12 with the polysilicon deposition layer 52 and to obtain the embedded gate electrodes 24 and the embedded emitter electrodes 25 that are embedded in the respective contact trenches 11 and 12. Next, the surface of the polysilicon deposition layer 52 is oxidized to form a polysilicon oxide film 53.

Figure 6F:
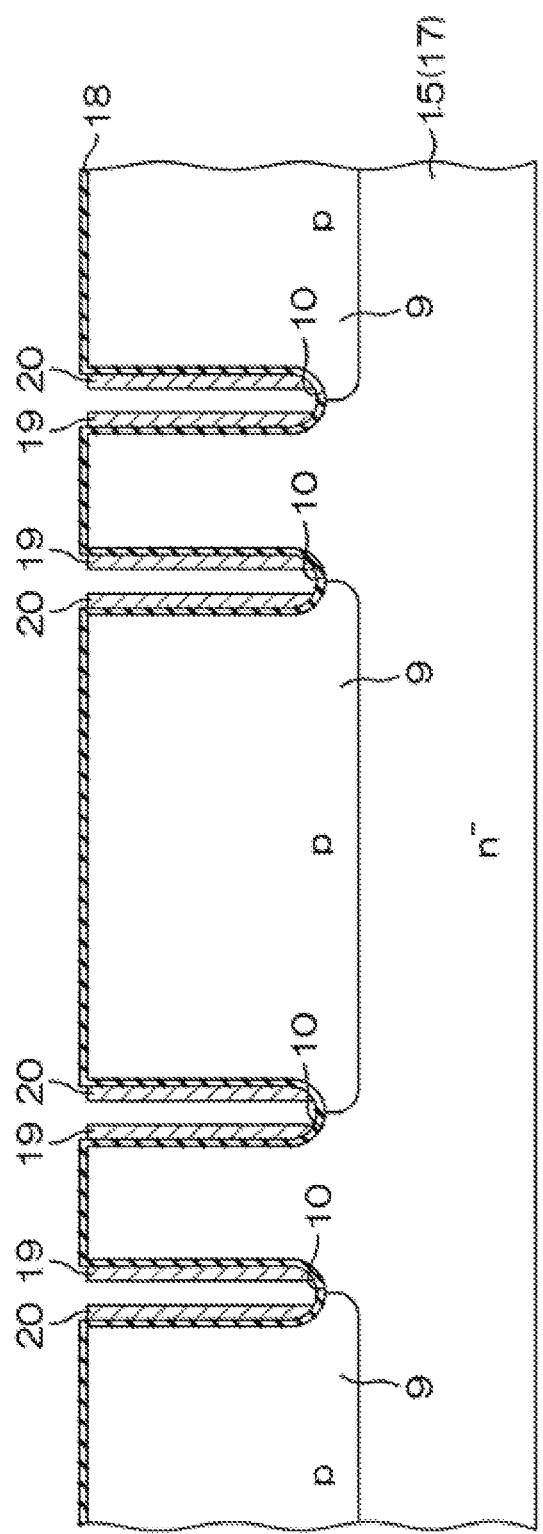
FIG. 6F is a view of the next manufacturing step after FIG. 6E.

Next, as shown in FIG. 6F, anisotropic etching such as RIE (reactive ion etching), for example, is used to selectively remove the polysilicon deposition layer 52 formed on the surface of the semiconductor substrate 15 and the bottom of the looped trenches 10 such that the polysilicon deposition layer 52 remains on the side faces of the looped trenches 10. This simultaneously forms the trench gates 19 and the emitter connecting parts 20.

Figure 6G:
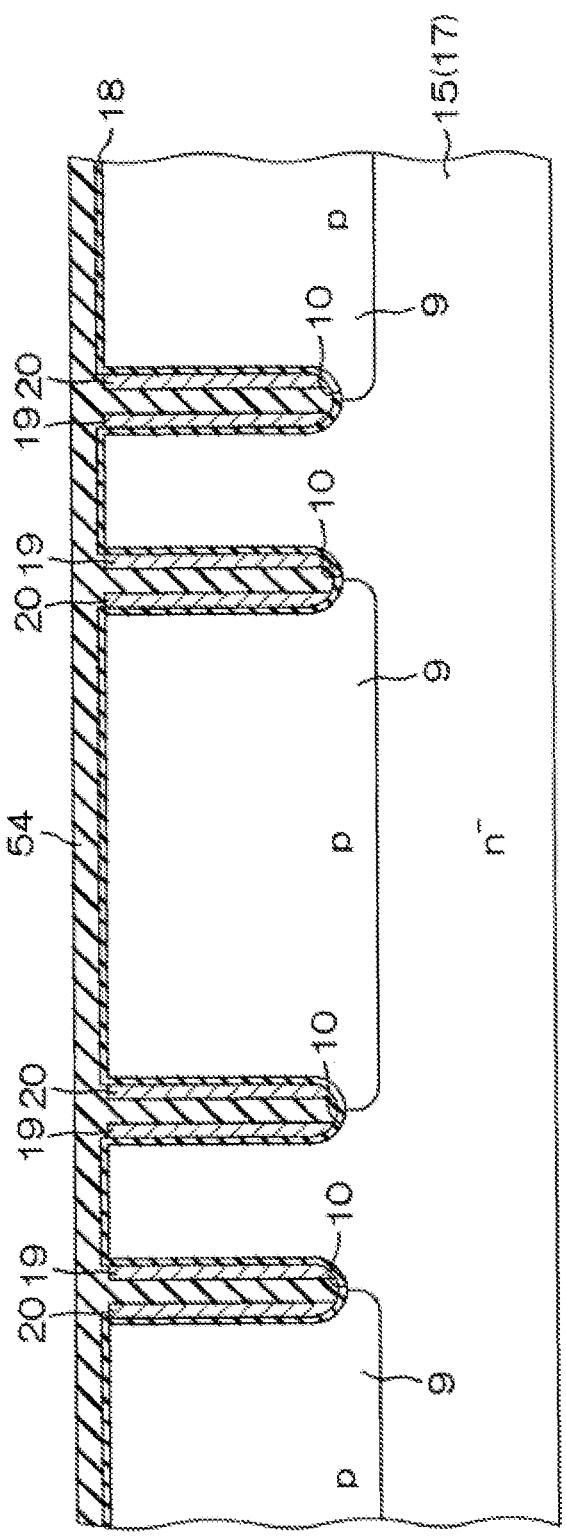
FIG. 6G is a view of the next manufacturing step after FIG. 6F.

Next, as shown in FIG. 6G, HDP-CVD (high density plasma CVD) or the like, for example, is used to deposit $SiO_2$ on the surface of the semiconductor substrate 15 so as to fill the looped trenches 10 (more specifically, the areas between the trench gates 19 and the emitter connecting parts 20). This forms a $SiO_2$ film 54.

Figure 6H:
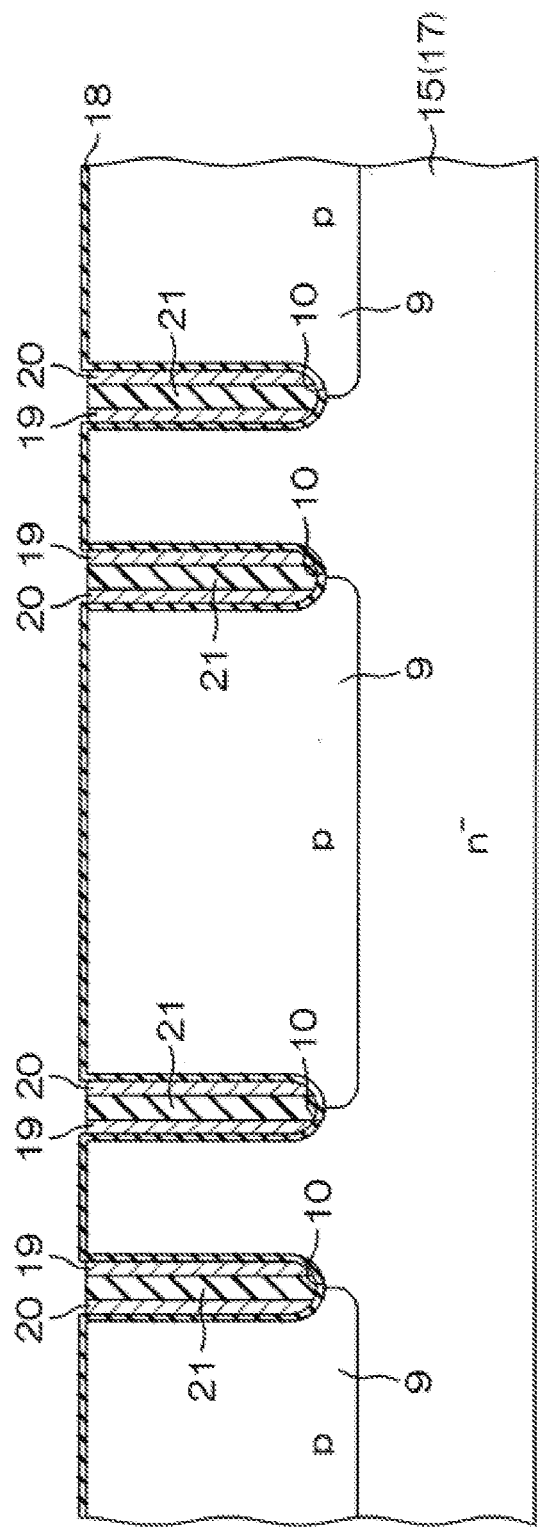
FIG. 6H is a view of the next manufacturing step after FIG. 6G.

Next, as shown in FIG. 6H, an etch-back process such as dry etching, for example, is performed on the surface of the $SiO_2$ film 54 such that this surface is substantially equal to the surface of the semiconductor substrate 15. This forms the center insulating film 21, which is interposed between the respective trench gates 19 and the emitter connecting parts 20.

Figure 6I:
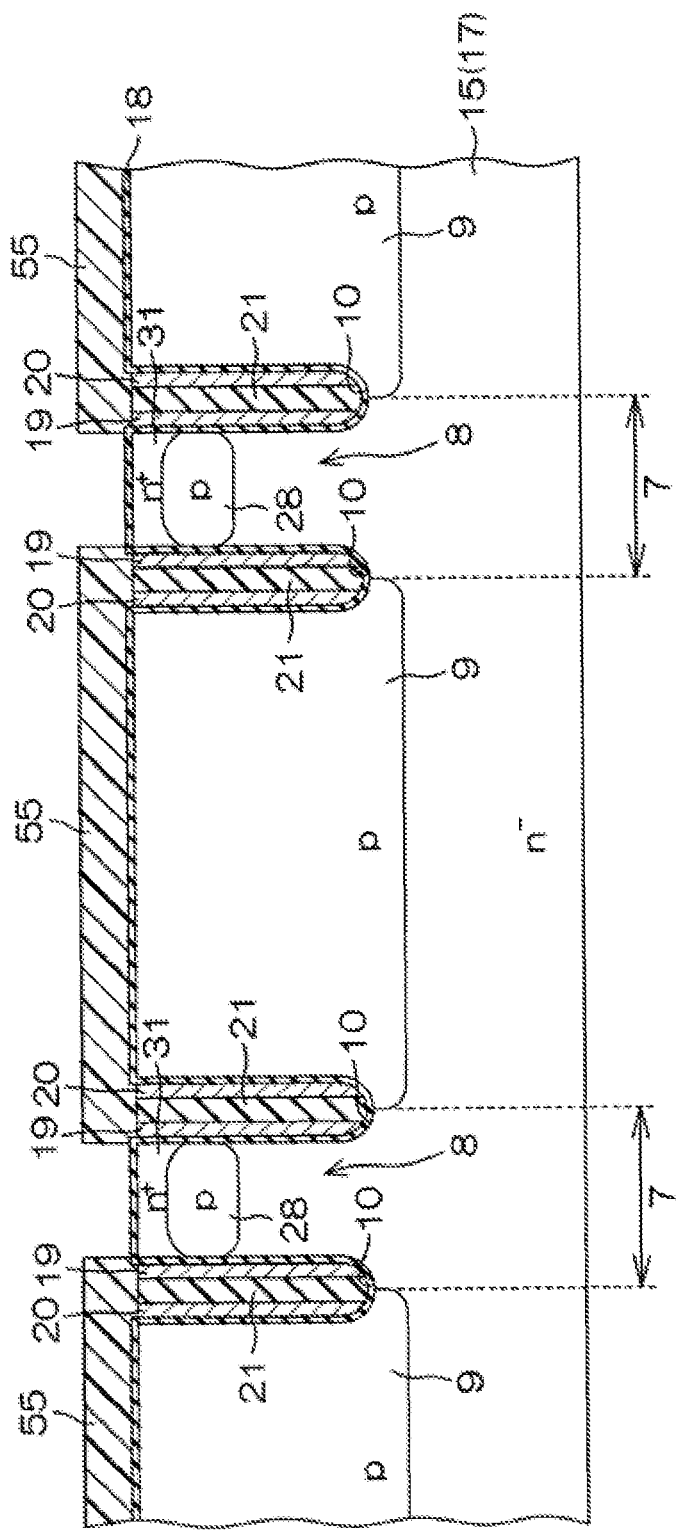
FIG. 6I is a view of the next manufacturing step after FIG. 6H.

Next, as shown in FIG. 6I, an ion implantation mask 55 is formed that has openings selectively corresponding to areas where the p-type base regions 28 and the n$^+$ emitter regions 31 will be formed. The p-type dopant and n-type dopant are selectively implanted in the semiconductor substrate 15 through this ion implantation mask 55. This forms the FET structures 8 that include the p-type base regions 28 and the n$^+$ emitter regions 31. After the p-type base regions 28 and the n$^+$ emitter regions 31 are formed, the ion implantation mask 55 is removed.

Figure 6J:
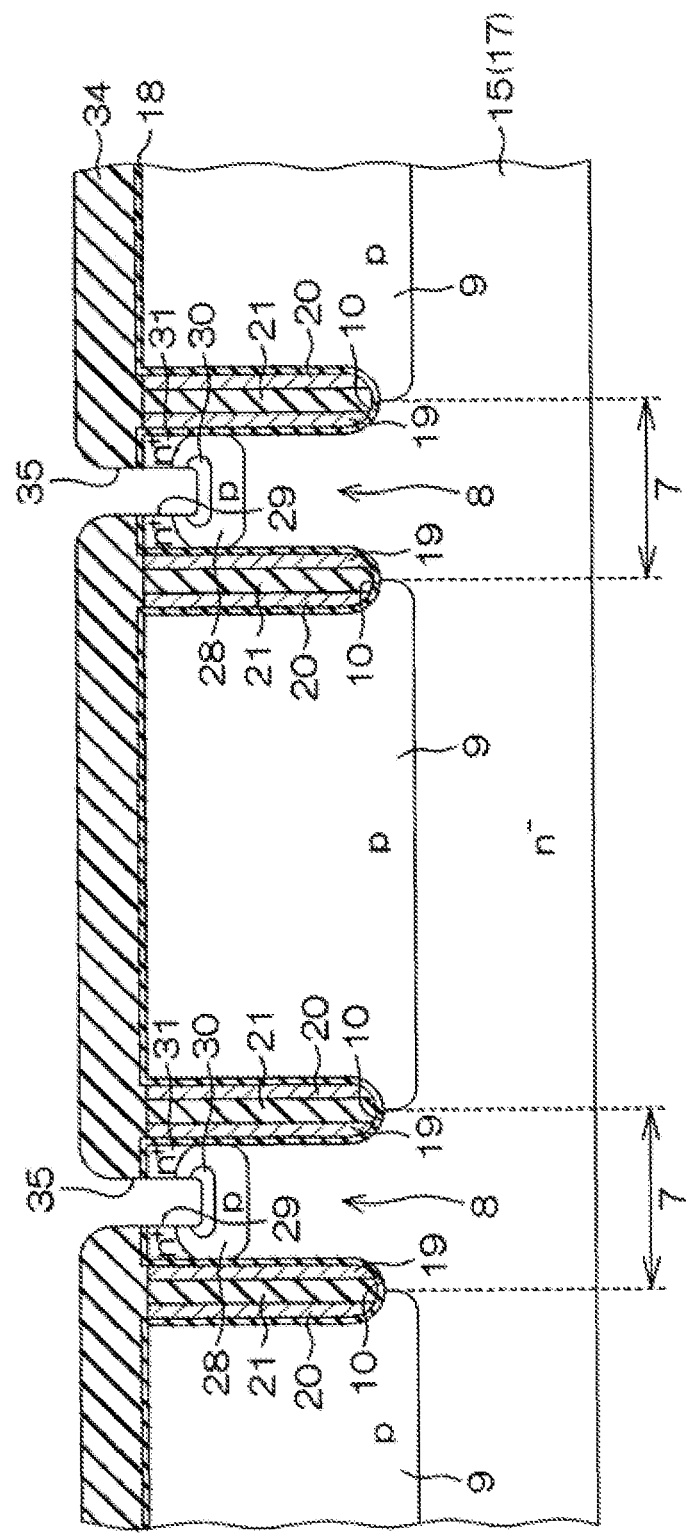
FIG. 6J is a view of the next manufacturing step after FIG. 6I.

Next, as shown in FIG. 6J, LP-CVD (low pressure CVD) or the like, for example, is used to deposit TEOS onto the semiconductor substrate 15, thereby forming the interlayer film 34. Next, a hard mask (not shown) having openings selectively corresponding to areas where the contact holes 35, the emitter contact holes 36, and the gate contact holes 37 (see FIG. 2B) will be formed is selectively formed on the interlayer film 34. An etching process is performed on the interlayer film 34 through this hard mask to form the respective contact holes 35, 36, and 37. The contact trenches 29 that are dug from the surface of the semiconductor substrate 15 are formed in the p-type base regions 29 at the same time that the respective contact holes 35, 36 and 37 are formed. After the contact trenches 29 are formed, the hard mask is removed. Next, the p-type dopant is implanted into the p-type base regions 28 through the contact trenches 29 to form the p$^+$ base contact regions 30.

Figure 6K:
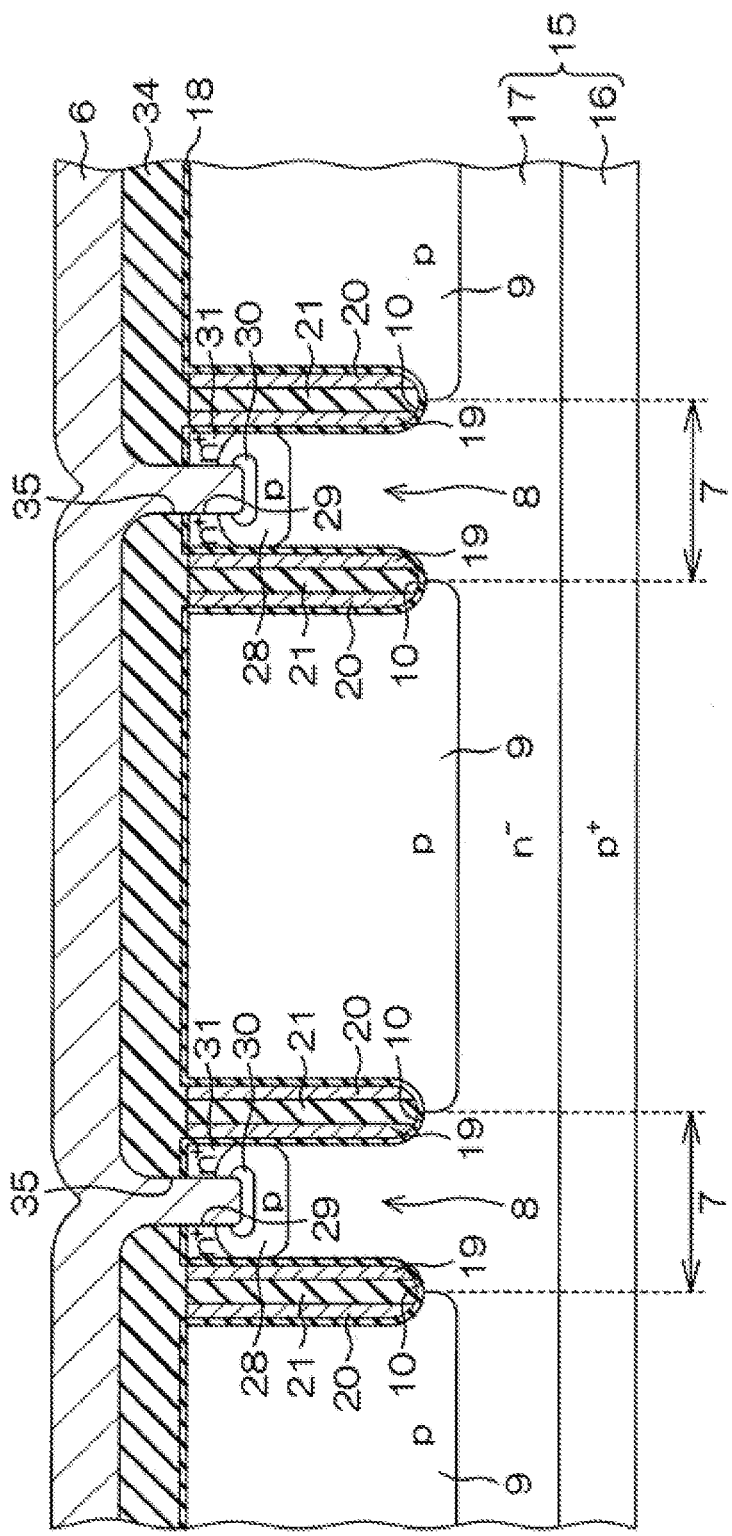
FIG. 6K is a view of the next manufacturing step after FIG. 6J.

Next, as shown in FIG. 6K, the material for the emitter electrode 6 and the gate finger 2 (gate pad 3) is deposited onto the interlayer film 34. Next, this material is patterned to simultaneously form the emitter electrode 6 and the gate finger 2 (gate pad 3). Next, the p-type dopant is selectively implanted into the rear surface of the semiconductor substrate 15 to form the p$^+$ collector region 16. This results in the semiconductor substrate 15 having the p$^+$ collector region 16 and the n$^-$ drain region 17 formed in this order from the rear surface thereof. The semiconductor device 1 is manufactured through the above-mentioned steps.

Figure 7:
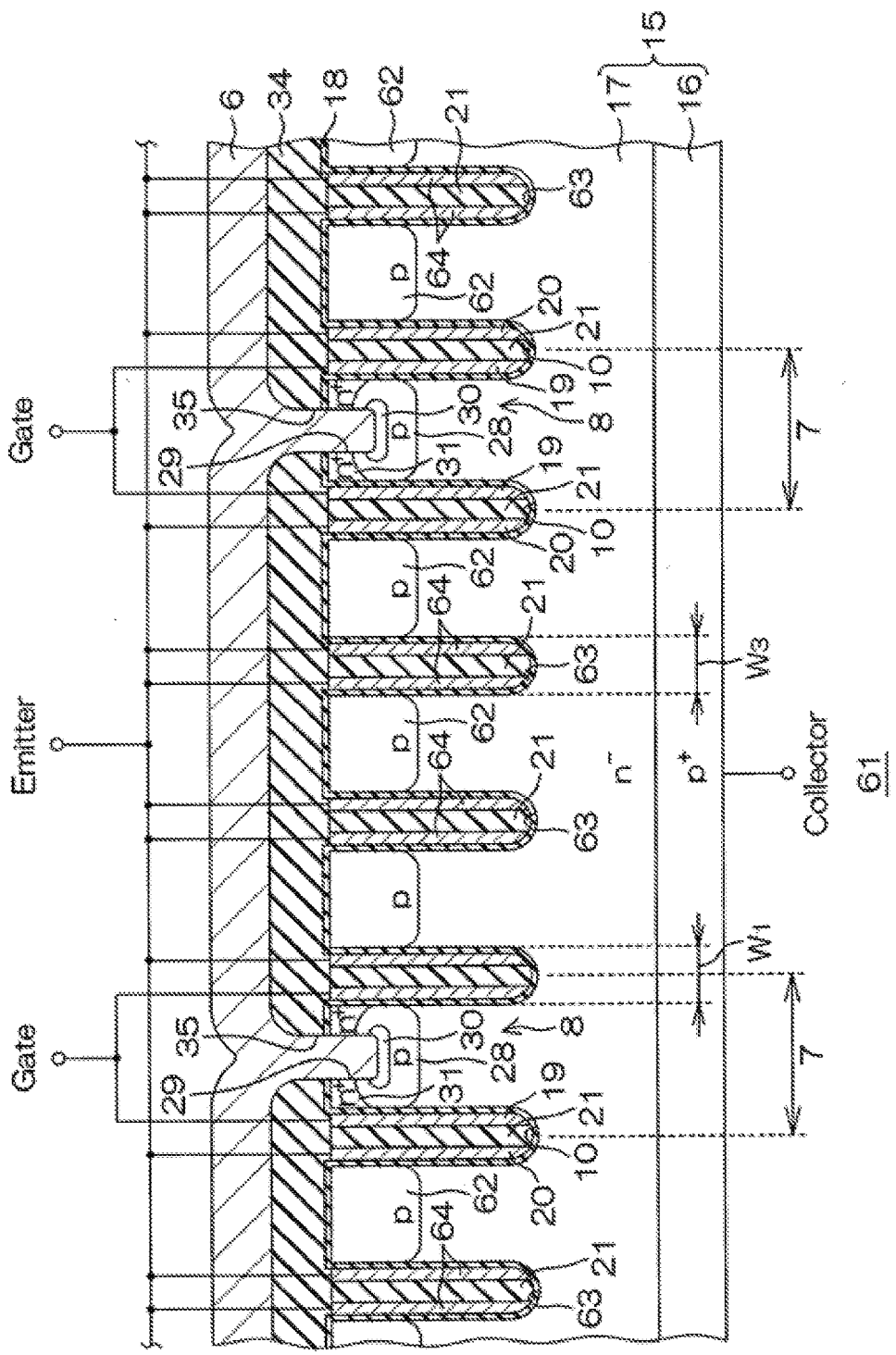
FIG. 7 is a schematic cross-sectional view of a semiconductor device according to Embodiment 2 of the present invention.

FIG. 7 is a schematic cross-sectional view of a semiconductor device 61 according to Embodiment 2 of the present invention. The semiconductor device 61 of Embodiment 2 differs from the semiconductor device 1 in Embodiment 1 in that p-type floating regions 62 are formed relatively shallow instead of the p-type floating regions 9, and in that a plurality of emitter trenches 63 are formed in an area surrounded by looped trenches 10. Other elements are similar to the semiconductor device 1 according to Embodiment 1 described above. In FIG. 7, portions corresponding to the portions in FIG. 2A are assigned the same reference characters and descriptions thereof will be omitted.

In the present embodiment, the p-type floating regions 62 are formed at the same depth as p-type base regions 28. The plurality of emitter trenches 63, which are second trenches of the present embodiment, are formed in the areas surrounded by the looped trenches 10 so as to penetrate the p-type floating regions 62. In this embodiment, an example is shown in which two of the emitter trenches 63 are formed in each area surrounded by the looped trenches 10, but more than two of the emitter trenches 63 may be formed. A configuration may also be used in which one emitter trench 63 is formed in each area surrounded by the looped trenches 10.

The emitter trenches 63 are formed so as to integrally continue from the looped trenches 10. More specifically, the emitter trenches 63 are formed in a stripe shape in a plan view in the lengthwise direction of the looped trenches 10 in the areas surrounded by the looped trenches 10, and continue from the looped trenches 10 at the respective short sides thereof. The emitter trenches 63 have the same cross-sectional shape as the looped trenches 10. In other words, a width $W_3$ of the emitter trenches 63 is the same width as the width $W_1$ of the looped trenches 10. The emitter trenches 63 are formed at the same depth as the looped trenches 10.

A pair of second emitter connecting parts 64 are formed in a stripe shape in a plan view in the respective emitter trenches 63 through an insulating film 18. The pair of second emitter connecting parts 64 have a similar configuration to the trench gates 19 and the emitter connecting parts 20 in Embodiment 1 described above. In other words, the pair of second emitter connecting parts 64 are formed in the respective emitter trenches 63 with gaps therebetween and are insulated from each other. More specifically, the pair of second emitter connecting parts 64 are each formed separated from each other in a film-like shape along the respective side faces of the emitter trenches 63 in the cross section shown in FIG. 7. There are spaces in the widthwise center of the emitter trenches 63, and these spaces are demarcated by the respective rear surfaces of the pair of second emitter connecting parts 64 (the side of the second emitter connecting parts 64 opposite to the side contacting the emitter trenches 63). These spaces are completely filled to the opening of the emitter trenches 63 by a center insulating film 21, thereby insulating the second emitter connecting parts in the pairs of second emitter connecting parts from each other.

The pairs of second emitter connecting parts 64 are each joined to the respective p-type floating regions 62 through the insulating film 18. The pairs of second transmitter junctions 64 are formed so as to integrally continue from emitter connecting parts 20 on the respective short sides of the looped trenches 10. Due to this, power is supplied from an emitter electrode 6 to the second emitter connecting parts 64 through the emitter connecting parts 20. The pair of second emitter connecting parts 64 are made of the same material as the trench gates 19 and the emitter connecting parts 20.

To form this type of semiconductor device 61, the layout of the hard mask 51 should be changed so as to form the emitter trenches 63 in the step of forming the looped trenches 10 in FIG. 6B described above, for example. Thereafter, the second emitter connecting parts 64 can be formed through the same step as the step in which the trench gates 19 and the emitter connecting parts 20 are formed (see FIGS. 6E to 6H).

As described above, even with the configuration of the semiconductor device 61 according to Embodiment 2, similar effects to the semiconductor device 1 of Embodiment 1 described above can be achieved.

Figure 8:
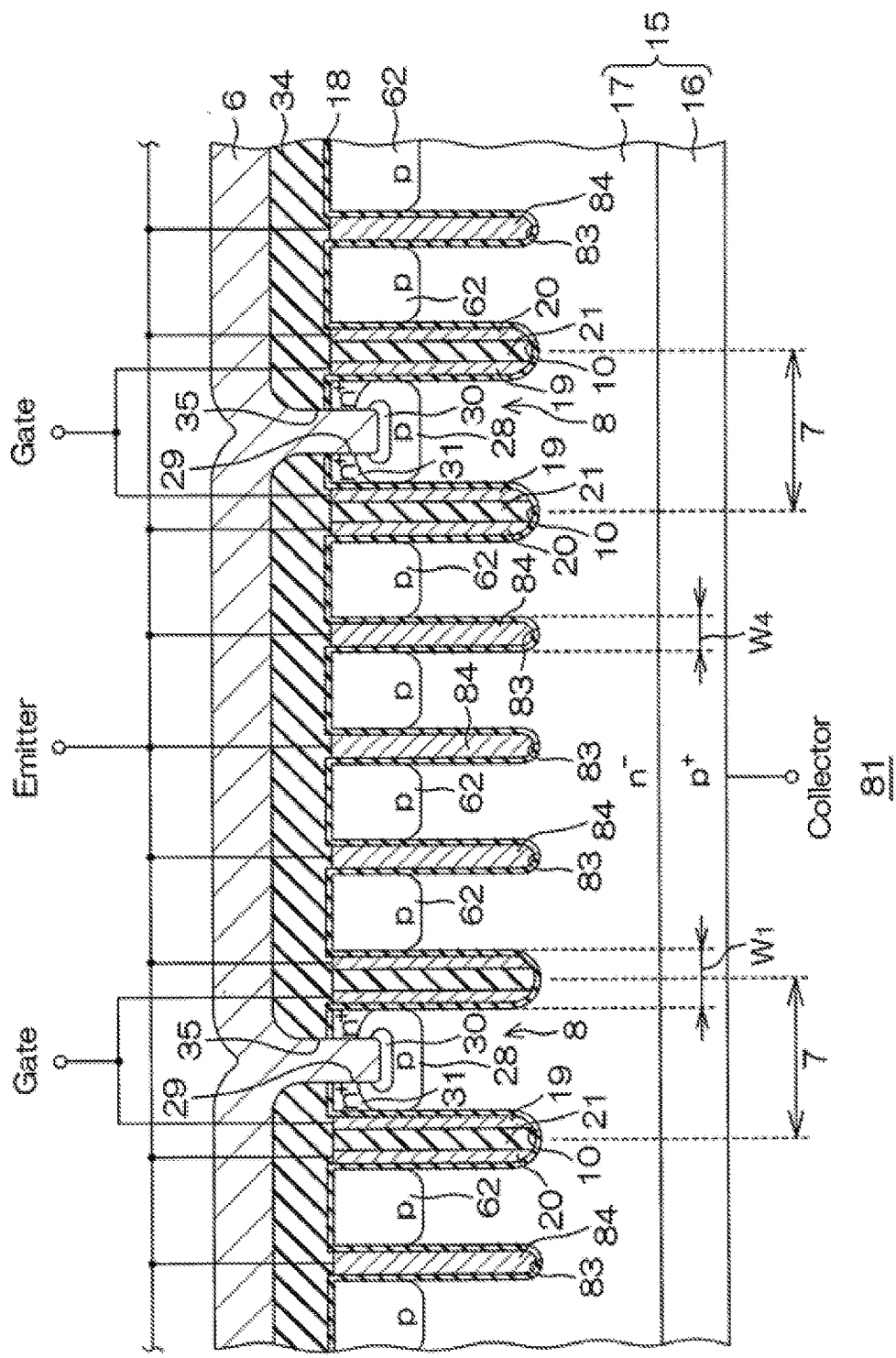
FIG. 8 is a schematic cross-sectional view of a semiconductor device according to Embodiment 3 of the present invention.

FIG. 8 is a schematic cross-sectional view of a semiconductor device 81 according to Embodiment 3 of the present invention. The semiconductor device 81 of Embodiment 3 differs from the semiconductor device 61 in Embodiment 2 in that emitter trenches 83 are formed with relatively narrow widths compared to looped trenches 10. Other elements are similar to the semiconductor device 61 according to Embodiment 2 described above. In FIG. 8, portions corresponding to the portions in FIG. 7 are assigned the same reference characters and descriptions thereof will be omitted.

A plurality of the emitter trenches 83 are formed with a narrower width than a width $W_1$ of the looped trenches 10 in areas surrounded by the looped trenches 10. A width $W_4$ of the emitter trenches 83 is formed at the same width as a width $W_2$ of the gate contact trenches 11 and emitter contact trenches 12 described above (see FIG. 2B), for example, or namely, 0.7 μm to 1.2 μm. In the present embodiment, an example is shown in which three of the emitter trenches 83 are formed, but a configuration may be used in which one or two of the emitter trenches 83 are formed. A configuration may also be used in which more than three of the emitter trenches 83 are formed.

In contrast to Embodiment 2 described above, in the present embodiment, pairs of second emitter connecting parts 64 are not formed, but rather second emitter connecting parts 84 are embedded as a whole in the respective emitter trenches 83.

As described above, even with the configuration of the semiconductor device 81, it is possible to attain effects similar to those described in Embodiment 2. The width $W_4$ of the emitter trenches 83 is less than a width $W_1$ of the looped trenches 10. Accordingly, in the step in FIG. 6E described above, it is possible to completely fill the emitter trenches 83, which have the width $W_4$ narrower than the looped trenches 10, with a polysilicon deposition layer 52 and to obtain the second emitter connecting parts 84 that are embedded in these emitter trenches 83 by following the same operating principle in which the respective contact trenches 11 and 12 having a relatively narrow width are completely filled by the polysilicon deposition layer 52.

Figure 9:
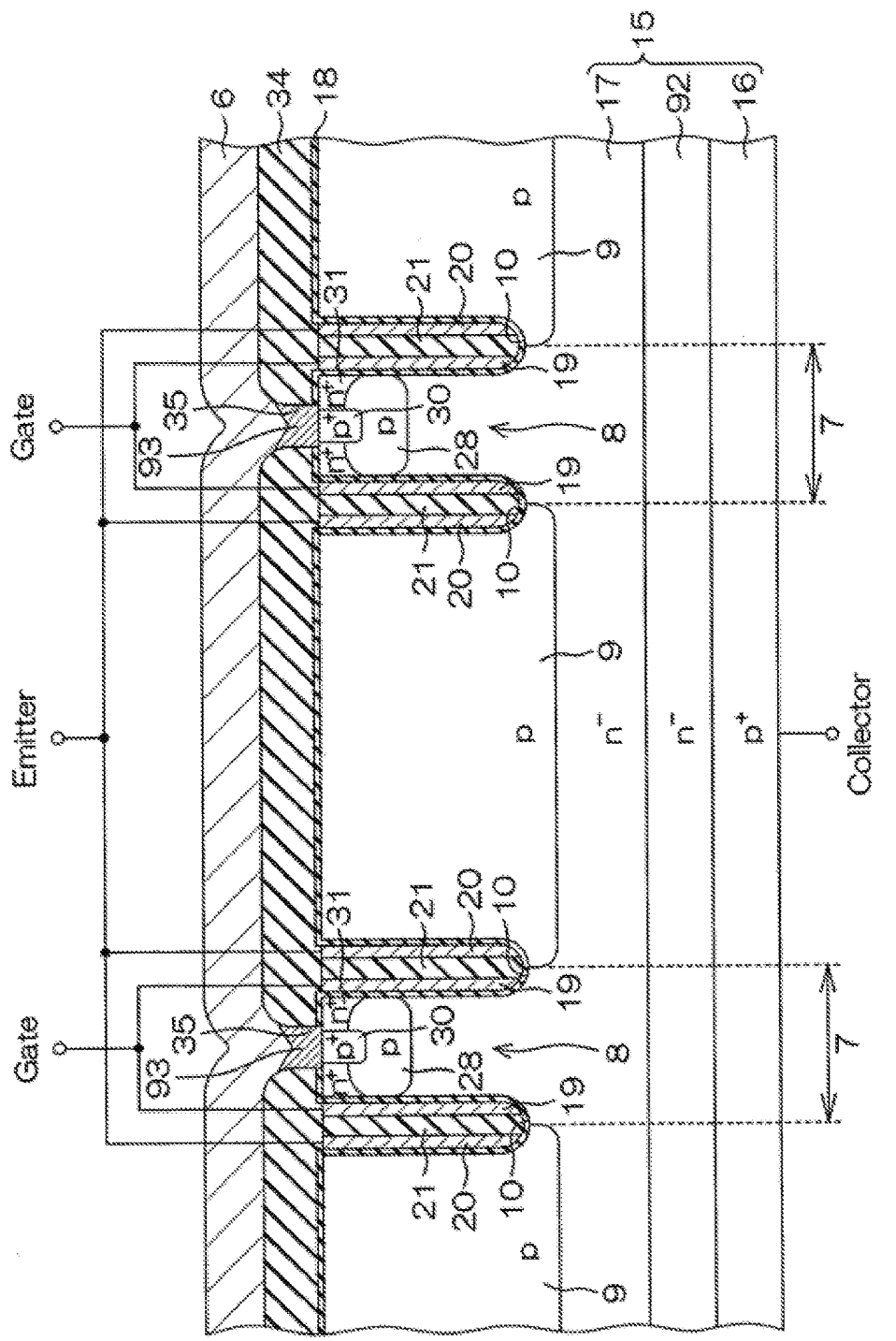
FIG. 9 is a schematic cross-sectional view of a semiconductor device according to Embodiment 4 of the present invention.

FIG. 9 is a schematic cross-sectional view of a semiconductor device 91 according to Embodiment 4 of the present invention. The semiconductor device 91 of Embodiment 4 differs from the semiconductor device 1 of Embodiment 1 in that a semiconductor substrate 15 has an n⁻ buffer region 92; there are no contact trenches 29; and a p⁺ base contact region 30 and a portion of an n⁺ emitter region 31 is therefore exposed on the surface of the semiconductor substrate 15. Other elements are similar to the semiconductor device 1 according to Embodiment 1 described above. In FIG. 9, portions corresponding to the portions in FIG. 2A are assigned the same reference characters and descriptions thereof will be omitted.

The semiconductor substrate 15 according to the semiconductor device 91 has the n⁻ buffer region 92 interposed between a p⁺ collector region 16 and an n⁻ drain region 17. The dopant concentration of the n⁻ buffer region 92 is $1 \times 10^{15}$ cm⁻³ to $5 \times 10^{17}$ cm⁻³, for example.

This type of n⁻ buffer region 92 can be formed by selectively implanting the n-type dopant into the rear surface side of the semiconductor substrate 15 in the step shown in FIG. 6K described above and before the step of forming the p⁺ collector region 16.

Tungsten contacts 93 constituted of tungsten are formed in respective contact holes 35 of the semiconductor device 91. The tungsten contacts 93 are connected to the p⁺ base contact regions 30 and portions of the n⁺ emitter regions 31 on the surface of the semiconductor substrate 15. An emitter electrode 6 is connected to the p⁺ base contact regions 30 and embedded emitter electrodes 25 through the tungsten contacts 93. A gate finger 2 is connected to embedded gate electrodes 24 through the tungsten contacts 93.

As described above, with the semiconductor device 91, the tungsten contacts 93 are formed in the respective contact holes 35; therefore, it is possible to achieve favorable contact. Accordingly, the contact trenches 29 do not need to be separately formed in the step shown in FIG. 6J. Furthermore, when the emitter electrode 6 and the gate finger 2 are formed in the step shown in FIG. 6K, the tungsten should be embedded in the respective contact holes 35; therefore, the manufacturing process is not needlessly complicated. In this manner, even with the configuration of the semiconductor device 91, it is possible to attain effects similar to those described in Embodiment 1.

Figure 10:
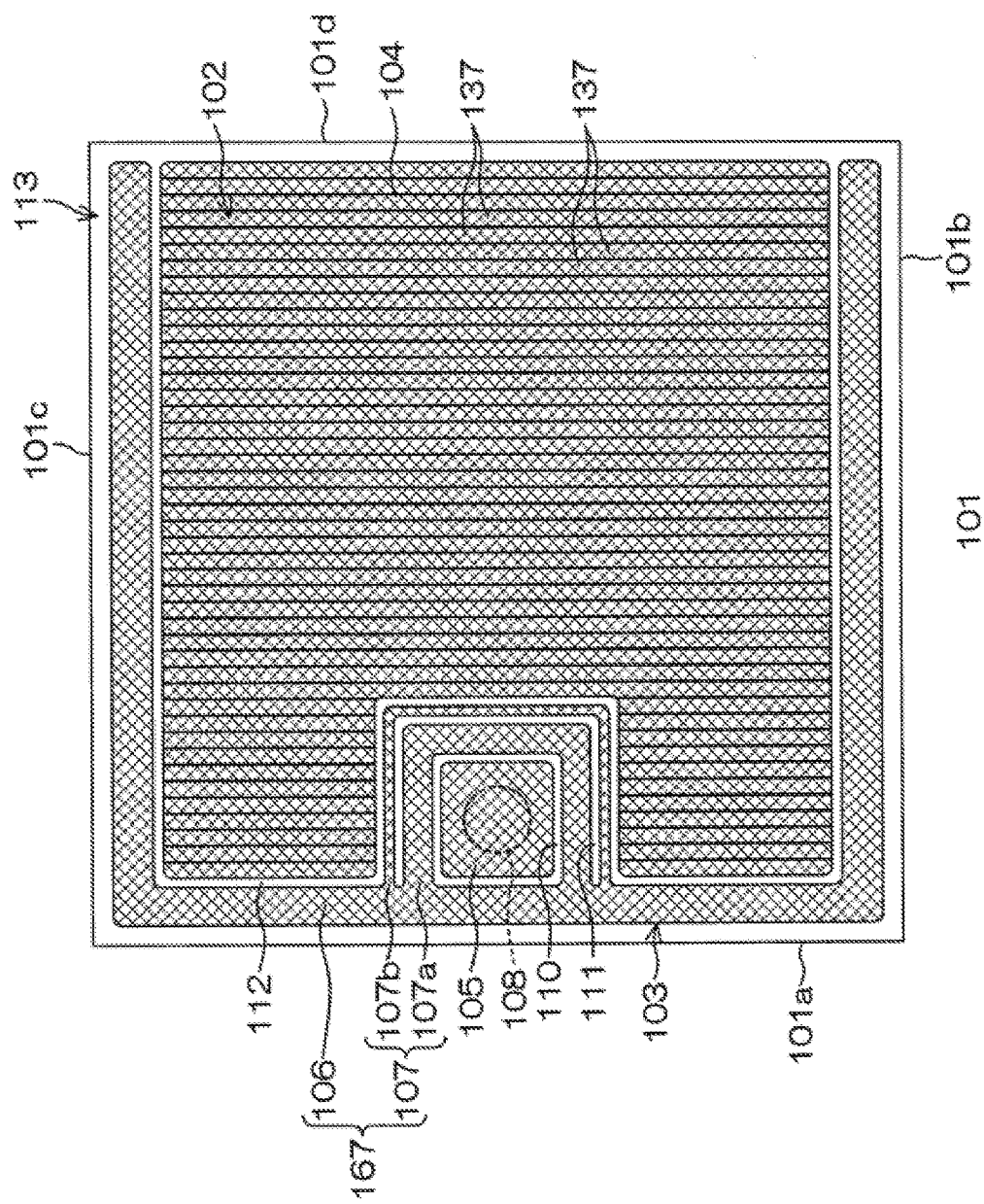
FIG. 10 is a schematic plan view of a semiconductor device according to Embodiment 5 of the present invention.

FIG. 10 is a schematic plan view of a semiconductor device 101 according to Embodiment 5 of the present invention.

As shown in FIG. 10, the semiconductor device 101 is formed in an equilateral chip shape in a plan view seen from a direction normal to the surface of the semiconductor device 101 (hereinafter, referred to simply as a "plan view"), for example. An active area 102 and an end area 113 that surrounds this active area 102 are defined on the semiconductor device 101. The active area 102 is formed in a substantially equilateral shape in a plan view on the semiconductor device 101. A plurality of gate trenches 137 are formed in stripe shapes on the active area 102.

A gate metal 103, which is one example of a surface gate metal that selectively surrounds the active area 102, and an emitter electrode 104 that selectively covers the active area 102 is formed on the surface of the semiconductor device 101. In FIG. 10 cross-hatching has been added to the gate metal 103 and the emitter electrode 104 for clarity. The gate metal 103 includes a gate pad 105 that is one example of a pad section, and a wiring section 167 constituted of a gate finger 106 and a pad peripheral section 107.

The gate pad 105 is formed in a substantially equilateral shape in a plan view in the lengthwise center of an area of the semiconductor device 101 that goes along a side 101a. The gate pad 105 receives external power by connecting to bonding wiring 108. The gate pad 105 is made of a metal material that includes Al (aluminum) as a main component thereof, for example.

The gate finger 106 is formed in a line shape so as to surround the active area 102 of the semiconductor device 101. More specifically, the gate finger 106 extends from the side of the gate pad 105 towards the stripe direction of the gate trenches 137 in a plan view (in other words, the direction along the side 101a of the semiconductor device 101) and also extends towards a direction orthogonal to the stripe direction, which intersects the side 101a at a right angle (in other words, the direction along a side 101b and a side 101c facing the side 101b). The pad peripheral section 107 is formed around the gate pad 105 and surrounds a first removal area 110.

In Embodiment 5, an example is described in which the gate pad 105 is disposed in the lengthwise center of an area along the side 101a of the semiconductor device 101, but the gate pad 105 may be formed on a corner of the semiconductor device 101. In Embodiment 5, an example is shown in which the gate finger 106 is not formed on the side 101d facing the side 101a of the semiconductor device 101, but the gate finger 106 may be formed around the entire semiconductor device 101.

The first removal area 110 is formed in a substantially equilateral loop in a plan view so as to surround the gate pad 105. The first removal area 110 is an area where the metal material has been removed, and this makes it so the gate pad 105 and the pad peripheral section 107 do not contact each other. In Embodiment 5, an example is described in which the first removal area 110 is formed in a loop shape that surrounds the entirety of the gate pad 105, but the first removal area 110 may selectively surround a portion of the gate pad 105.

The pad peripheral section 107 is formed in a substantially equilateral loop so as to surround the gate pad 105 in a plan view. The pad peripheral section 107 is formed so as to integrally continue from the gate finger 106 on the side of the gate pad 105. A second removal area 111 that selectively surrounds the first removal area 110 is formed on the pad peripheral section 107, and this demarcates the pad peripheral section 107 into an inner area 107a surrounded by the first removal area 110 and the second removal area 111, and an outer area 107b that surrounds this inner area 107a.

The emitter electrode 104 is formed in the area of the semiconductor device 101 demarcated by the gate metal 103 across a third removal area 112. The third removal area 112 is formed in a line shape along the gate metal 103. The emitter electrode 104 is formed so as to cover the active area 102. First lead out wiring 115, gate finger lead out wiring 116, and second lead out wiring 117 (see FIG. 11) are formed across an interlayer insulating film 145 (see FIG. 13A) in an area that is a layer below the gate metal 103 and the emitter electrode 104.

Figure 11:
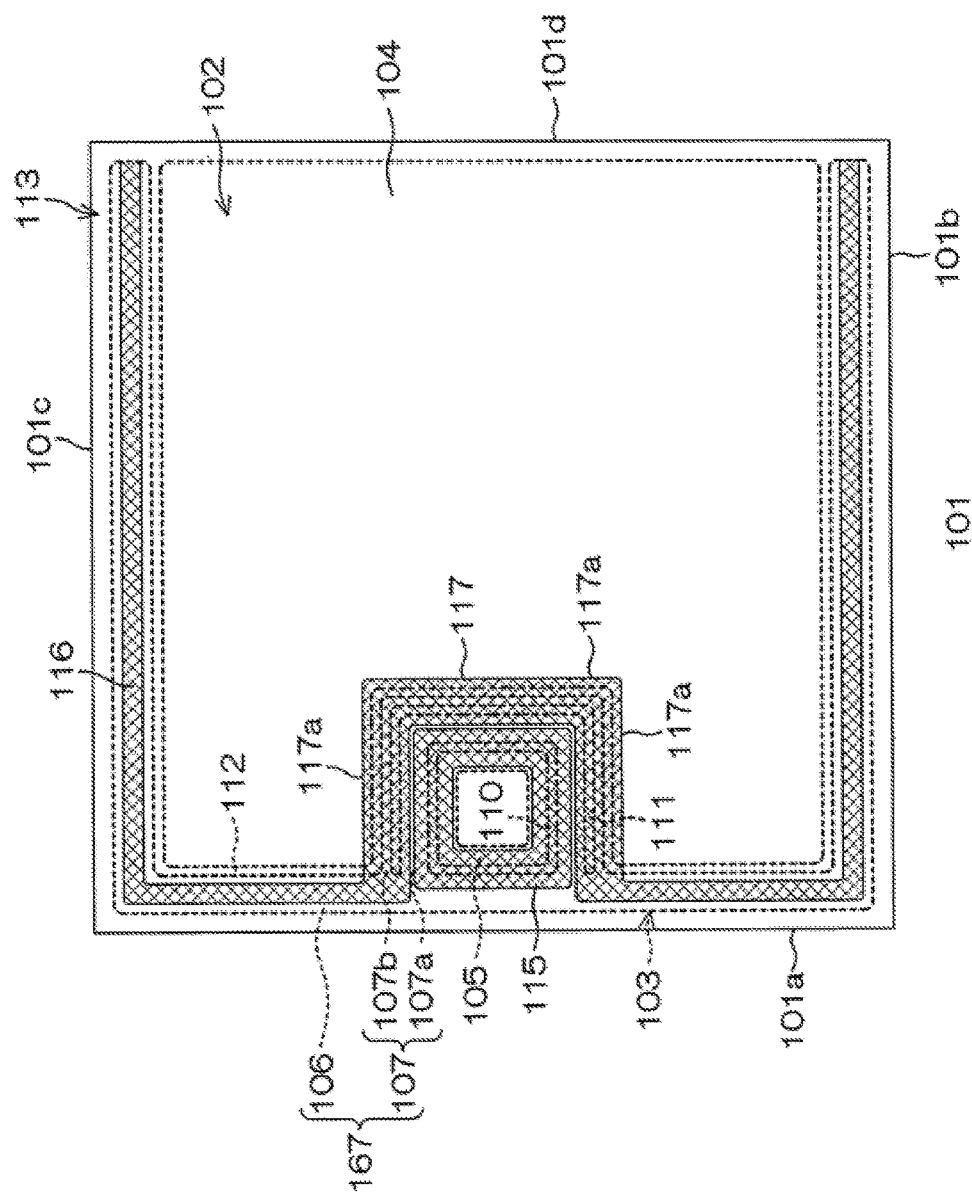
FIG. 11 is a schematic plan view for explaining lead out wiring of the semiconductor device according to Embodiment 5.
Figure 12:
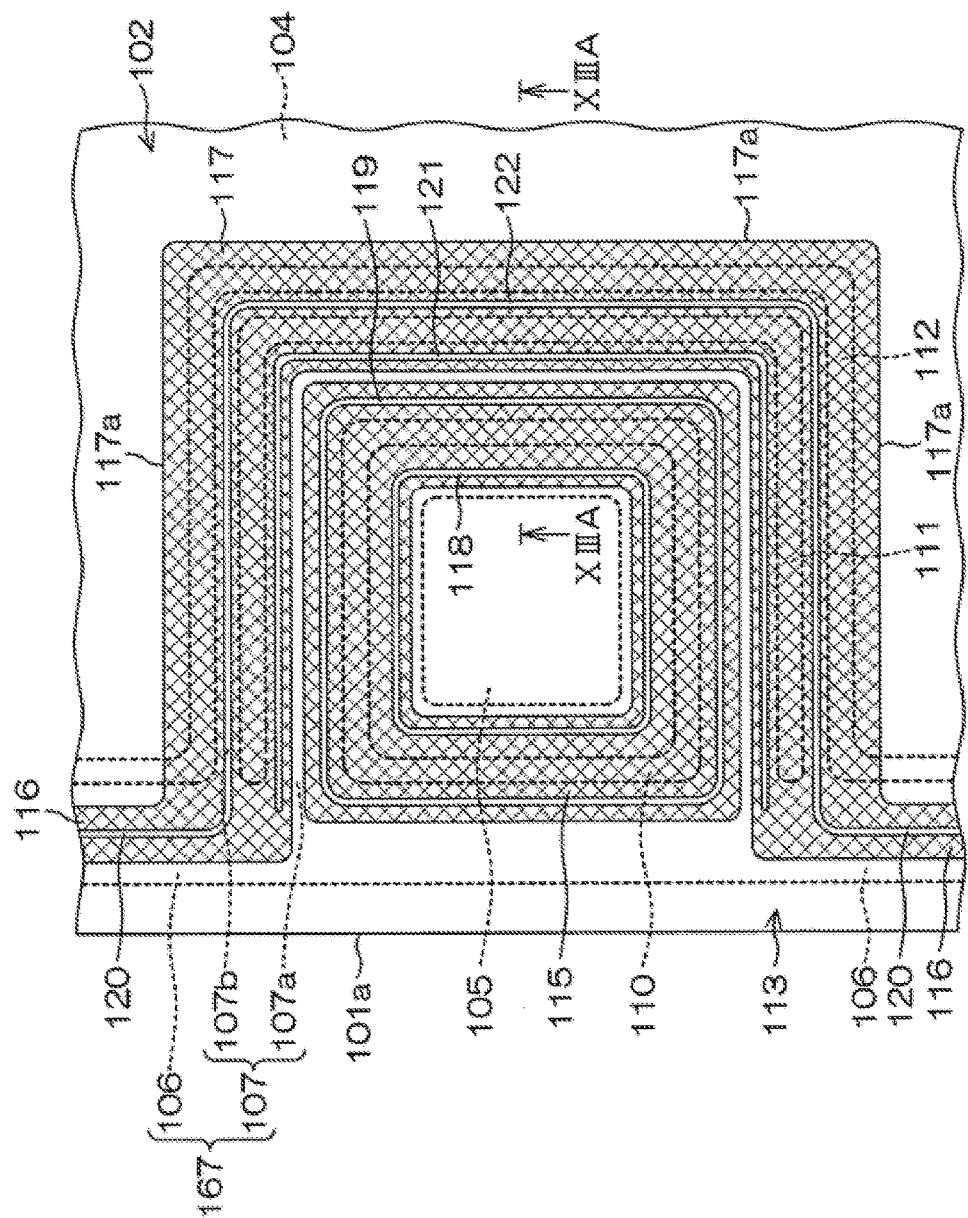
FIG. 12 is a plan view in which the lead out wiring of the semiconductor device shown in FIG. 10 have been magnified.

FIG. 11 is a schematic plan view for explaining the first lead out wiring 115, the gate finger lead out wiring 116, and the second lead out wiring 117 of the semiconductor device 101 according to Embodiment 5. FIG. 12 is a plan view in which the first lead out wiring 115, the gate finger lead out wiring 116, and the second lead out wiring 117 of the semiconductor device 101 shown in FIG. 10 have been magnified.

As shown in FIG. 11, the first lead out wiring 115 is formed in a closed group structure in a plan view so as to straddle the gate pad 105 and the pad peripheral section 107 in a layer below the gate pad 105. More specifically, the first lead out wiring 115 is formed in an equilateral loop from the gate pad 105 to the inner area 107a of the pad peripheral section 107 across the first removal area 110. It is preferable that the first lead out wiring 115 be made of a material having a higher resistance than the gate metal 103, such as an electrode material such as polysilicon, for example.

Figure 13A:
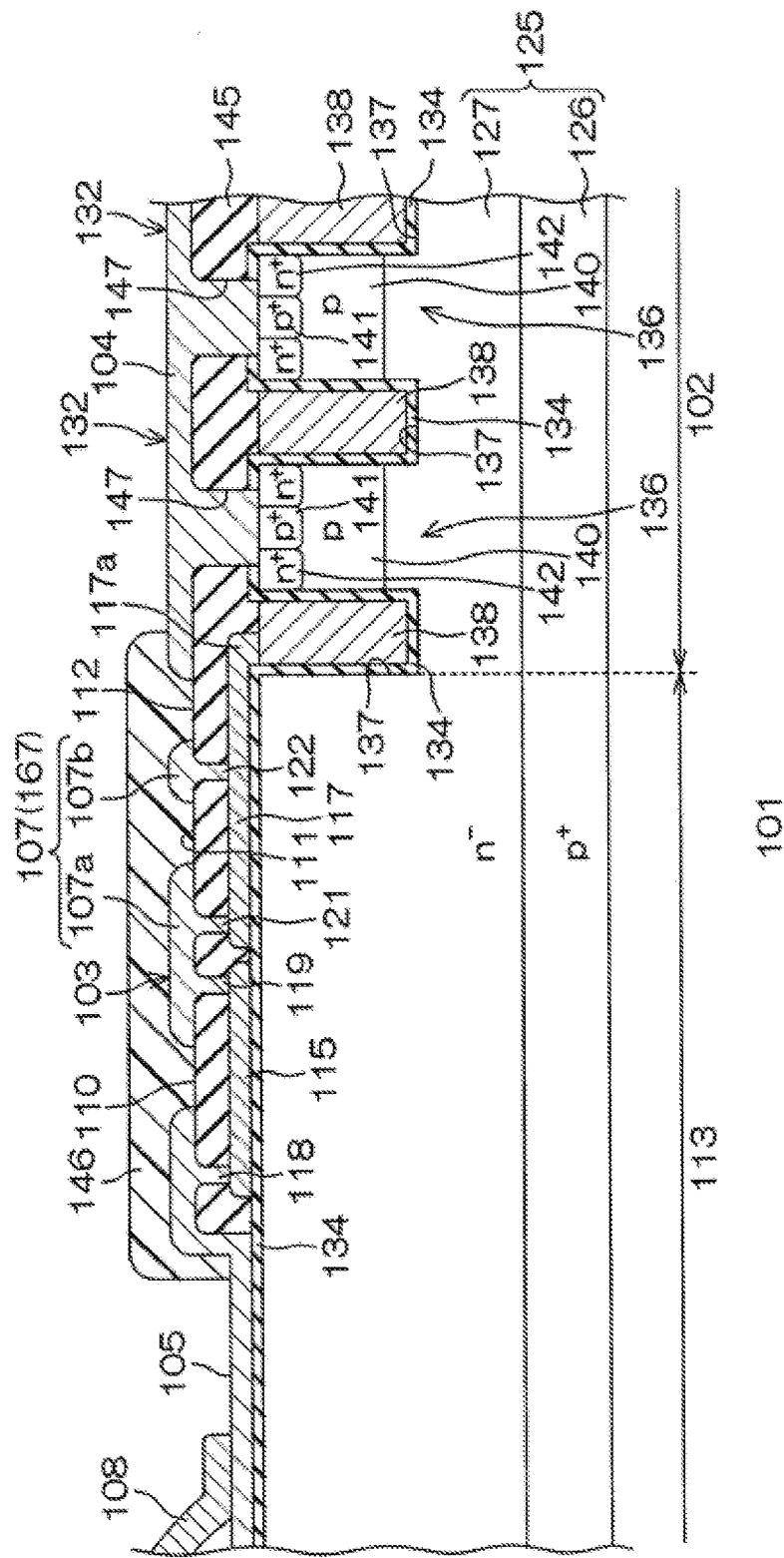
FIG. 13A is a cross-sectional view of FIG. 12 along XIIIA-XIIIA.

As shown in FIGS. 12 and 13A, the first lead out wiring 115 is electrically connected to the gate pad 105 through a gate pad contact 118 and electrically connected to the pad peripheral section 107 through a first pad peripheral section contact 119. The gate pad contact 118 is formed in an equilateral loop in a plan view surrounding the gate pad 105. Meanwhile, the first pad peripheral section contact 119 is formed in an equilateral loop in a plan view surrounding the first removal area 110 in the inner area 107a of the pad peripheral section 107. In this manner, the gate pad 105 is electrically connected to the pad peripheral section 107 and the gate finger 106 via the first lead out wiring 115.

The gate finger lead out wiring 116 is formed in a layer below the gate finger 106. The gate finger lead out wiring 116 has a narrower width than the gate finger 106 and is completely covered by the gate finger 106. The gate finger lead out wiring 116 is made of the same electrode material as the first lead out wiring 115. As shown in FIG. 12, the gate finger lead out wiring 116 is electrically connected to the gate finger 106 via a gate finger contact 120.

The second lead out wiring 117 is formed having a prescribed gap from the first lead out wiring 115 and selectively surrounds the first lead out wiring 115. The second lead out wiring 117 is formed so as to straddle the pad peripheral section 107 and the active area 102. More specifically, the second lead out wiring 117 is formed so as to go across the second removal area 111, the outer area 107b of the pad peripheral section 107, and the third removal area 112 from the inner area 107a of the pad peripheral section 107. The second lead out wiring 117 integrally continues from the gate finger lead out wiring 116 on a side of the area where the gate pad 105 is formed. The second lead out wiring 117 is formed of the same electrode material as the first lead out wiring 115.

As shown in FIG. 12, the second lead out wiring 117 is electrically connected to the inner area 107a of the pad peripheral section 107 via a second pad peripheral section contact 121 and electrically connected to the outer area 107b of the pad peripheral section 107 via a third pad peripheral section contact 122. The second pad peripheral section contact 121 is formed in a line shape selectively surrounding the first pad peripheral section contact 119 in the inner area 107a of the pad peripheral section 107. Meanwhile, the third pad peripheral section contact 122 is formed in a line shape surrounding the second removal area 111 in the outer area 107b of the pad peripheral section 107, and integrally continues from the gate finger contact 120 on a side of the area where the gate pad 105 is formed. In this manner, the pad peripheral section 107 is electrically connected to the gate finger 106 through the second lead out wiring 117.

Next, a partial cross-sectional configuration of the semiconductor device 101 will be explained using FIG. 13A. FIG. 13A is a cross-sectional view of FIG. 12 along XIIIA-XIIIA As shown in FIG. 13A, the semiconductor device 101 includes a semiconductor substrate 125, which is one example of a semiconductor layer. The semiconductor substrate 125 is an $n^-$ silicon substrate, for example, and is formed of a $p^+$ collector region 126 and an $n^-$ drain region 127 layered in this order from the rear surface side thereof. The $p^+$ collector region 126 is formed on the entire rear surface of the semiconductor substrate 125, and the $n^-$ drain region 127 is formed on the entire front surface of the semiconductor substrate 125. The dopant concentration of the $p^+$ collector region 126 is $5 \times 10^{15}$ cm$^{-3}$ to $2 \times 10^{19}$ cm$^{-3}$, for example. The p-type dopant can be B (boron), Al (aluminum), or the like, for example (the same for hereinafter). The dopant concentration of the $n^-$ drain region 127 is $5 \times 10^{13}$ cm$^{-3}$ to $1 \times 10^{15}$ cm$^{-3}$, for example. The n-type dopant can be N (nitrogen), P (phosphorous), As (arsenic), or the like, for example (the same for hereinafter).

A plurality of the gate trenches 137 are formed in a stripe shape on the active area 102 of the semiconductor substrate 125. Areas having a uniform width are disposed between the plurality of gate trenches 137, and an IGBT single cell 136 is formed in each of these areas.

The gate trenches 137 are dug from the surface of the semiconductor substrate 125. More specifically, the gate trenches 137 are formed at a uniform width and have side faces that are approximately perpendicular to the surface of the semiconductor substrate 125 and a top opening that is formed so as to be on the same level as the surface of the semiconductor substrate 125.

The single cells 136 are formed along the stripe direction of the gate trenches 137 and each includes a p-type base region 140, a p$^+$ base contact region 141, and n$^+$ emitter regions 142 formed above this p-type base region 140.

The p-type base region 140 is shared by the gate trench 137 on one side thereof and the gate trench 137 on the other side thereof. The bottom of the p-type base region 140 is closer to the surface side of the semiconductor substrate 125 than the bottom of the gate trenches 137. The dopant concentration of the p-type base region 140 is $1\times10^{16}$ cm$^{-3}$ to $1\times10^{18}$ cm$^{-3}$, for example.

The n$^+$ emitter regions 142 are formed on the surface of the semiconductor substrate 125. One each of the n$^+$ emitter regions 142 is disposed on both side faces of the gate trenches 137 and each is exposed to the side faces of the gate trenches 137. The dopant concentration of the n$^+$ emitter region 142 is $1\times10^{19}$ cm$^{-3}$ to $1\times10^{21}$ cm$^{-3}$, for example. Meanwhile, the p$^+$ base contact region 141 is sandwiched between the n$^+$ emitter regions 142. The dopant concentration of the p$^+$ base contact region 141 is $1\times10^{19}$ cm$^{-3}$ to $1\times10^{21}$ cm$^{-3}$, for example.

An insulating film 134 is formed on the surface of the semiconductor substrate 125 and the inner surface (side faces and bottom) of the gate trenches 137. The insulating film 134 is an insulating material made of silicon oxide (SiO$_2$), silicon nitride (SiN), aluminum oxide (Al$_2$O$_3$), or the like, for example. Gate electrodes 138 are embedded in the respective gate trenches 137 through the insulating film 134.

The gate electrodes 138 are embedded in the respective gate trenches 137 such that the top surface of the gate electrode 138 exposed from the gate trench 137 is at the same level as the top surface of the semiconductor substrate 125. It is preferable that the electrode material of the gate electrodes 138 be the same electrode material as the first and second lead out wiring 115 and 117, for example. In this case, it is possible to form the first and second lead out wiring 115 and 117 in the same step as the gate electrodes 138, which can simplify the manufacturing process.

The first and second lead out wiring 115 and 117 and the gate finger lead out wiring 116 (see FIG. 11) are formed on the surface of the semiconductor substrate 125 across the insulating film 134. The second lead out wiring 117 includes a drawn out part 117a that is drawn out from the active area 102 along the direction going across the stripes.

The gate electrodes 138 are electrically connected to the gate finger lead out wiring 116 on both ends in the lengthwise direction of the gate trenches 137, and the lead out wiring line 116 is formed so as to go across the gate trenches 137. This electrically connects the gate electrodes 138 to the gate finger 106 via the gate finger lead out wiring 116. As shown in FIG. 13A, the gate electrodes 138 are electrically connected to the drawn out part 117a. This electrically connects the gate electrodes 138 to the pad peripheral section 107 via the drawn out part 117a. The second lead out wiring 117 may have the drawn out part 117a (see FIGS. 11 and 12) that is drawn out from the active area 102 along the stripe direction, and this may electrically connect the second lead out wiring 117 to the pad peripheral section 107.

The interlayer insulating film 145 is formed on the surface of the semiconductor substrate 125. Emitter contact holes 147 that selectively expose the p$^+$ base contact regions 141 and portions of the n$^+$ emitter regions 142 are formed in the interlayer insulating film 145 in the active area 102. The gate pad contact 118, the first pad peripheral section contact 119, the gate finger contact 120 (see FIG. 12), the second pad peripheral section contact 121, and the third pad peripheral section contact 122 are respectively formed in the interlayer insulating film 145 in the end area 113. The interlayer insulating film 145 is an insulating material made of tetra-ethyl orthosilicate (TEOS), boron phosphorous silicate glass (BPSG), silicon oxide (SiO$_2$), or the like, for example.

The gate metal 103 and the emitter electrode 104 are formed on the interlayer insulating film 145. The emitter electrode 104 is electrically connected to the p$^+$ base contact regions 141 and portions of the n$^+$ emitter regions 142 via the emitter contact holes 147.

Meanwhile, as described above, the gate metal 103 is electrically connected to the first and second lead out wiring 115 and 117 via the respective contacts 118, 119, 121, and 122. This electrically connects the gate metal 103 to the gate electrodes 138 via the first and second lead out wiring 115 and 117 and the drawn out part 117a of the second lead out wiring 117, thereby forming a current pathway that leads surface current from the gate pad 105 to the gate electrodes 138.

A surface protective film 146 is formed on the interlayer insulating film 145 so as to selectively cover the area between the gate pad 105 and the emitter electrode 104. The surface protective film 146 is made of a resin, for example.

Figure 13B:
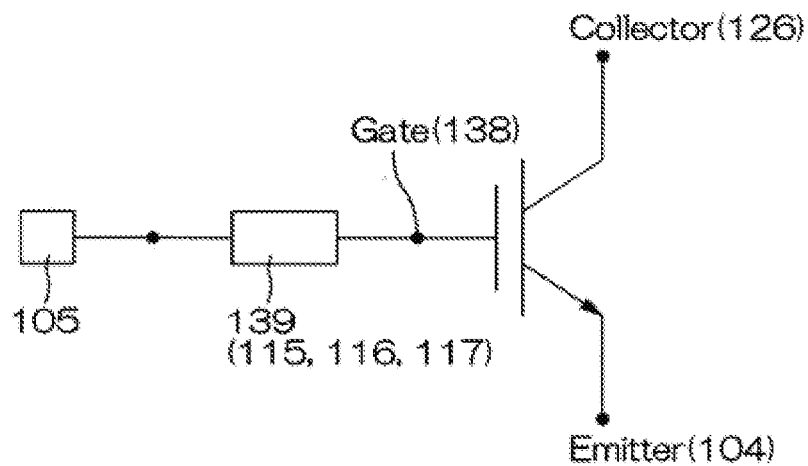
FIG. 13B is an electrical circuit map for explaining the electrical structure of the semiconductor device shown in FIG. 10.

The semiconductor device 101 is expressed by the electrical circuit map shown in FIG. 13B. FIG. 13B is an electrical circuit map for explaining the electrical structure of the semiconductor device 101 shown in FIG. 10.

As shown in FIG. 13B, the semiconductor device 101 includes the gate pad 105, and a current restricting unit 139 interposed between the gate pad 105 and gate electrodes 138. The current restricting unit 139 includes a resistance component of the first lead out wiring 115, a resistance component of the gate finger lead out wiring 116, and a resistance component of the second lead out wiring 117, which are connected in series to the gate pad 105. When a voltage is applied to the gate pad 105, current flows to the gate electrodes 138 through the current restricting unit 139.

As described above and shown in FIGS. 12, 13A, and 13B, with this configuration of the semiconductor device 101, when current flows from the gate pad 105 to the pad peripheral section 107 and the gate finger 106, this current passes through the first and second lead out wiring 115 and 117 (the current restricting unit 139); therefore, it is possible to restrict current flowing to the pad peripheral section 107 and the gate finger 106 due to surface current at a position close to the gate pad 105. This makes it possible to suppress an MIS gate structure 132 from turning ON locally as a result of inrush current (di/dt) locally flowing to the gate electrodes 138 in the MIS gate structure 132 at a position close to the gate pad 105 (in particular, the peripheral section of the gate pad 105 that is electrically connected via the pad peripheral section 107). As a result, it is possible to suppress variation in the applied current between the respective MIS gate structures 132 regardless of distance from the gate pad 105.

Even if inrush current flows to the inner area 107*a* of the pad peripheral section 107 from the gate pad 105, this inrush current will pass through the second lead out wiring 117 or go around the third removal area 112 and flow to the outer area 107*b* of the pad peripheral section 107. In other words, it is possible to doubly restrict current flowing to the gate electrodes 138 at the peripheral section of the gate pad 105. Accordingly, it is possible to effectively restrict inrush current flowing to the gate electrodes 138 of the MIIS gate structures 132 arranged in the vicinity of the gate pad 105. Meanwhile, the gate finger 106 contacts the gate electrodes 138 of the MIS gate structures 132 at a relatively far position from the gate pad 105, which allows for inrush current to be restricted.

Figure 14A:
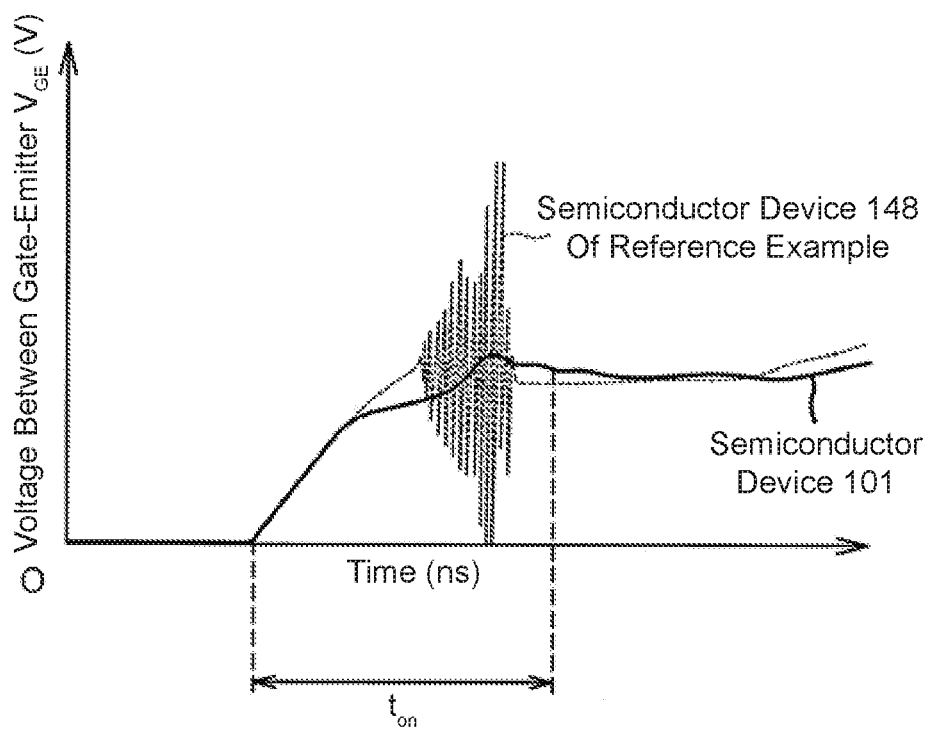
FIG. 14A is a graph showing switching characteristics of the semiconductor device shown in FIG. 10.
Figure 14B:
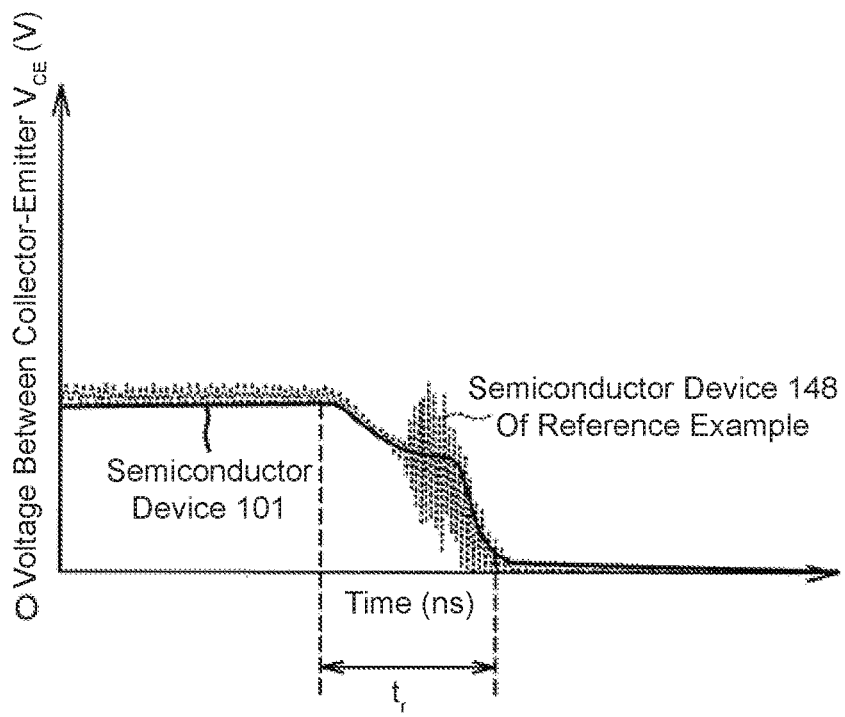
FIG. 14B is a graph showing switching characteristics of the semiconductor device shown in FIG. 10.
Figure 14C:
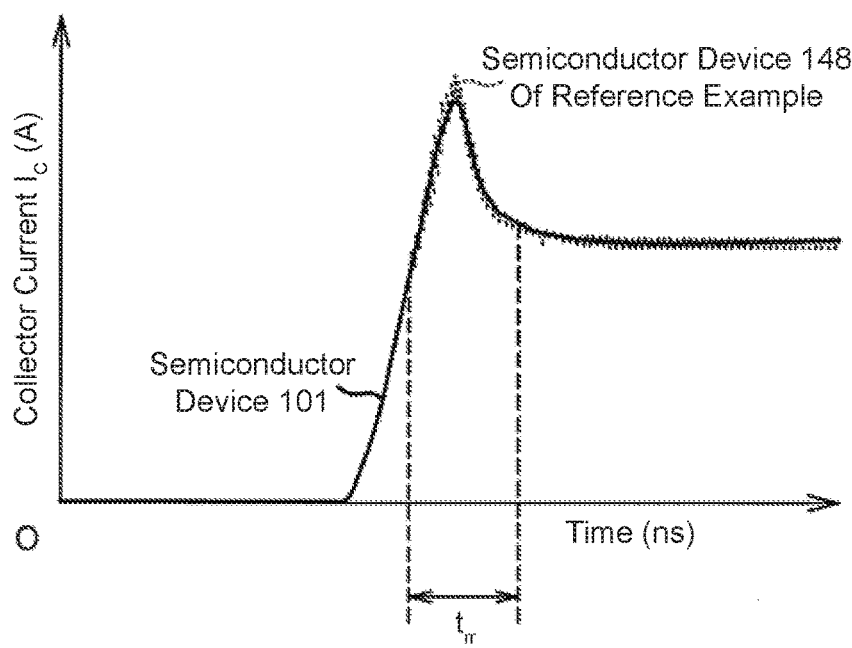
FIG. 14C is a graph showing switching characteristics of the semiconductor device shown in FIG. 10.

When the switching characteristics of the semiconductor device 101 were investigated, the graphs shown in FIGS. 14A to 14C were obtained.

FIG. 14A to 14C are graphs showing switching characteristics of the semiconductor device 101 shown in FIG. 10.

FIG. 14A shows the relationship between a voltage $V_{GE}$ (V) between the gate emitters of the semiconductor device 101 and time (nsec), FIB. 14B shows the relationship between a voltage $V_{CE}$ (V) between the collector emitters of the semiconductor device 101 and time (nsec), and FIG. 14C shows a relationship between a collector current $I_C$ (A) of the semiconductor device 101 and time (nsec). In FIGS. 14A to 14C, the characteristics of the semiconductor device 101 are shown with a solid line, and the switching characteristics of a semiconductor device 148 according to a reference example are shown with a dotted line. The semiconductor device 148 according to the reference example does not have the first and second lead out wiring 115 and 117.

As shown in FIG. 14A, in the semiconductor device 148 of the reference example, noise is generated at the voltage $V_{GE}$ at the gate emitters during a turn ON time $t_{on}$. In contrast, in the semiconductor device 101, there is no noise such as that in the semiconductor device 148 of the reference example. The turn ON time $t_{on}$ is defined as the time that is necessary for the voltage $V_{CE}$ between the collector emitters to fall to 10% of the maximum value thereof from the start of the voltage $V_{GE}$ between the gate emitters during turn ON time of the IGBT.

As shown in FIG. 14B, in the semiconductor device 148 of the reference example, noise can be confirmed to be generated at the voltage $V_{CE}$ between the collector emitters during a rise time $t_r$. In contrast, in the semiconductor device 101, there is no noise such as that in the semiconductor device 148 of the reference example. The rise time $t_r$ is defined as the time that is necessary for the voltage $V_{CE}$ between the collector emitters to fall to 10% of the maximum value thereof from the time when the collector current $I_C$ rises to 10% of the maximum value thereof during turn ON of the IGBT.

As shown in FIG. 14C, in the semiconductor device 148 of the reference example, noise can be confirmed to be generated at the collector current $I_C$ during reverse recovery time $t_{rr}$. In contrast, in the semiconductor device 101, there is no noise such as that in the semiconductor device 148 of the reference example. Reverse recovery time $t_{rr}$ is defined as the time that is necessary for the reverse recovery current of the internal diodes to disappear. In the semiconductor device 101, while the peak current value is lower than the semiconductor device 148 of the reference example, there is almost no change in the effective current value. This is because current other than the current detected as effective current, or namely, the surface current (inrush current) flowing to the target metal 103, flows to the gate electrodes 138 via the first and second lead out wiring 115 and 117.

The generation of noise in the semiconductor device 148 of the reference example will be explained next using FIGS. 14A to 14C. Namely, the parasitic inductance or parasitic capacitance normally forms an LC resonant circuit on the gate pad 105 formed around the MIS gate structures 132, the pad peripheral section 107, and the gate finger 106. Therefore, when surface current flows, the switching of the MIS gate structures 132 acts as a trigger for generating the resonance noise. In the semiconductor device 148 according to the reference example, there is no first and second lead out wiring 115 and 117, and thus it is not possible to restrict this type of surface current. Accordingly, in the semiconductor device 148 according to the reference example, waveforms of the resonance noise are detected as shown in FIGS. 14A to 14C.

In contrast, according to the configuration of the semiconductor device 101, it is possible to restrict current flowing to the pad peripheral section 107 and the gate finger 106 due to surface current, and thus it is possible to suppress the MIS gate structures 132 turning ON locally. Therefore, it is possible to suppress the switching of the MIS gate structures 132 triggering the generation of the resonance noise. Therefore, it is possible to reduce switching loss caused by resonance noise during switching ON.

In the manner described above, it is possible to provide a semiconductor device 101 that can effectively restrict inrush current and that can reduce switching loss and the generation of resonance noise.

Figure 15:
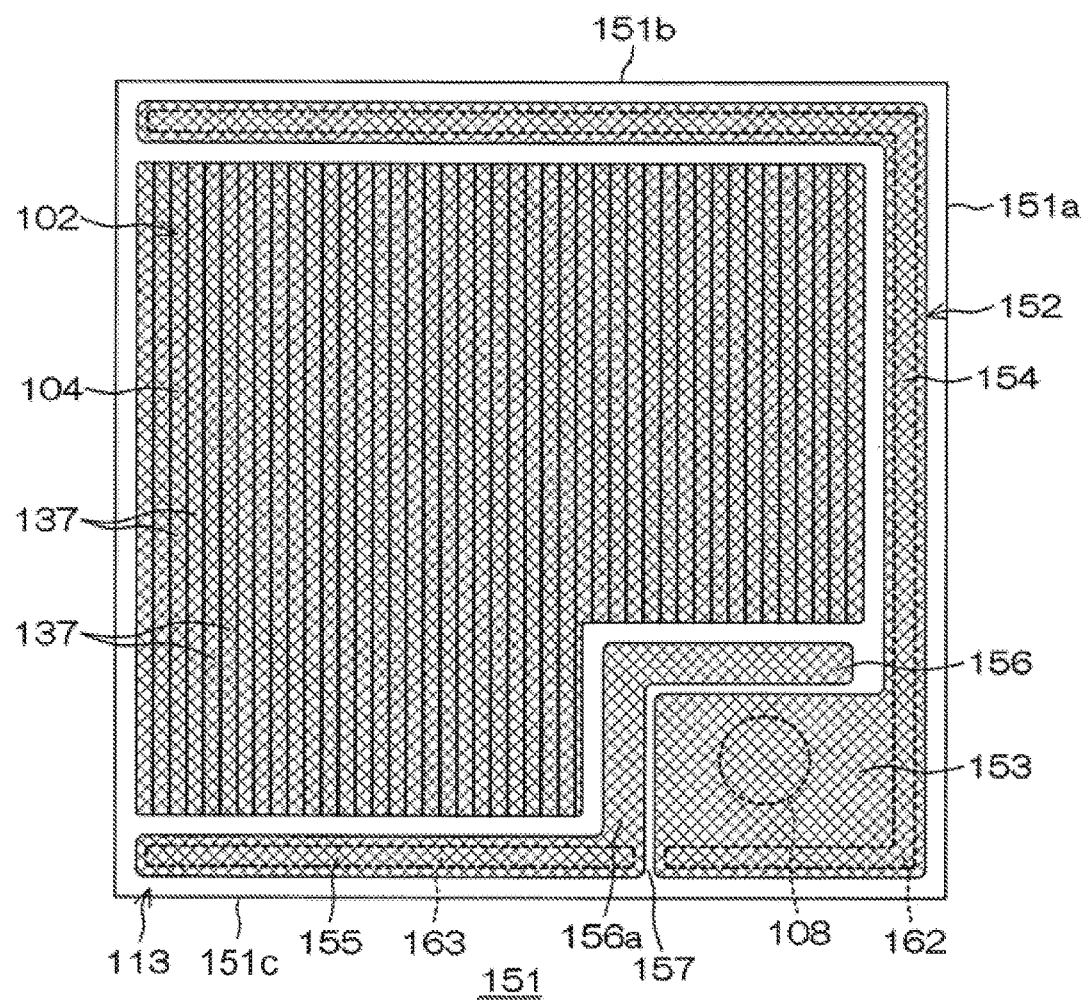
FIG. 15 is a schematic plan view of a semiconductor device according to Embodiment 6.
Figure 16:
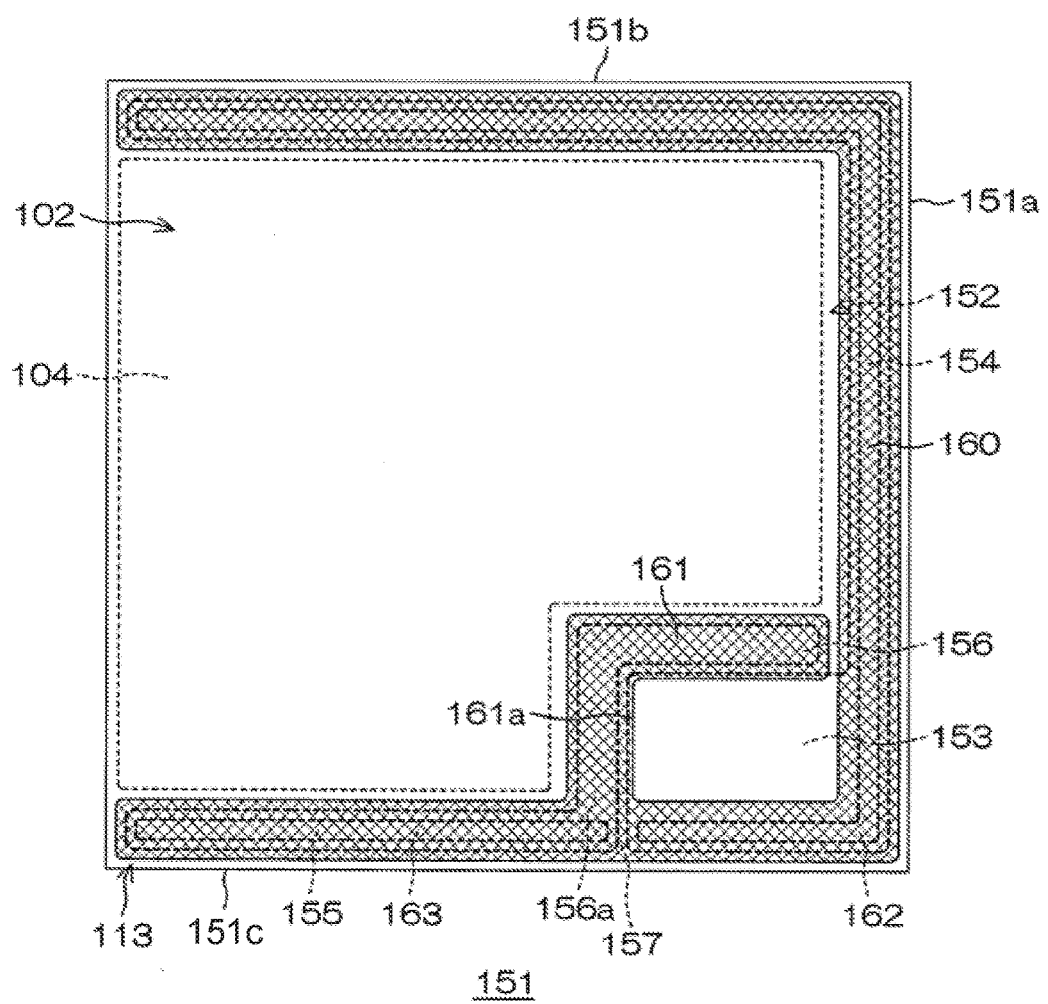
FIG. 16 is a schematic plan view for explaining lead out wiring of the semiconductor device according to Embodiment 6.

FIG. 15 is a schematic plan view of a semiconductor device 151 according to Embodiment 6 of the present invention. FIG. 16 is a schematic plan view for explaining a first and second lead out wiring 160 and 161 of the semiconductor device 151 according to Embodiment 6. The semiconductor device 151 in Embodiment 6 differs from the semiconductor device 101 in Embodiment 5 in that a gate metal 152 is formed instead of the gate metal 103. Other elements are similar to the semiconductor device 101 according to Embodiment 5 described above. In FIGS. 15 and 16, portions corresponding to the portions in FIGS. 10 and 13A are assigned the same reference characters and descriptions thereof will be omitted. In a manner similar to Embodiment 5 described above, the semiconductor device 151 is formed in an equilateral chip shape in a plan view, and a plurality of gate trenches 137 are formed in stripe shapes on an active area 102.

As shown in FIG. 15, the gate metal 152, which is one example of a surface gate metal, is formed on an end area 113 of the semiconductor device 151 so as to selectively surround an active area 102. The gate metal 152 includes a gate pad 153, which is one example of a pad section, a first gate finger 154, a second gate finger 155, and a wiring section 168 made of a pad peripheral section 156.

In Embodiment 6, the gate pad 153 is formed on one corner of the semiconductor device 151. The gate pad 153 receives external power by connecting to bonding wiring 108.

The first gate finger 154, the second gate finger 155, and the pad peripheral section 156 are formed in line shapes so as to surround the active area 102 of the semiconductor device 151.

The first gate finger 154 is formed so as to integrally continue from the gate pad 153. More specifically, the first gate finger 154 extends from the gate pad 153 towards the stripe direction of the gate trenches 137 (in other words, the direction along a side 151a of the semiconductor device 151) and also extends towards a direction orthogonal to the stripe direction, which intersects the side 151a at a right angle (in other words, a direction along another side 151b.). The first gate finger 154 is formed so as to go across an end in the lengthwise direction of the gate trenches 137 in an area along the side 151b of the semiconductor device 151.

The pad peripheral section 156 is formed so as to selectively surround the inner sides of the gate pad 153 across a removal area 157. The removal area 157 is formed in a line shape along the periphery of the gate pad 153. In other words, the pad peripheral section 156 is isolated from the gate pad 153 and the first gate finger 154 by this removal area 157.

The second gate finger 155 is formed along a side 151c that faces the side 151b of the semiconductor device 151. More specifically, the second gate finger 155 is formed so as to go across the other end in the lengthwise direction of the gate trenches 137 from the gate pad 153 and so as to integrally continue from an end 156a of the pad peripheral section 156. In other words, the second gate finger 155 is also isolated from the gate pad 153 and the first gate finger 154.

As shown in FIG. 16, the first lead out wiring 160 and the second lead out wiring 161 are formed in an area below the gate metal 152.

The first lead out wiring 160 is formed so as to straddle the first gate finger 154 and the second gate finger 155. More specifically, the first lead out wiring 160 goes across the area where the removal area 157 is formed, and is formed along the area where the first gate finger 154, the gate pad 153, and the second gate finger 155 are formed. The first lead out wiring 160 is formed having a greater width than the first gate finger 154 and the second gate finger 155. It is preferable that the first lead out wiring 160 be made of a material having a higher resistance than the gate metal 152, such as an electrode material such as polysilicon, for example.

The second lead out wiring 161 is formed along the area where the pad peripheral section 156 is formed. The second lead out wiring 161 is formed having a greater width than the pad peripheral section 156. The second lead out wiring 161 is formed so as to integrally continue from the first lead out wiring 160 on the side of the area where the second gate finger 155 is formed. The end 161a of the second lead out wiring 161 on the gate pad 153 side goes across the removal area 157 to the gate pad 153.

As shown in FIGS. 15 and 16, the gate pad 153 and the first gate finger 154 are electrically connected to the first lead out wiring 160 through a first contact 162 formed along the gate pad 153 and the first gate finger 154.

Meanwhile, the pad peripheral section 156 and the second gate finger 155 are electrically connected to the first lead out wiring 160 through a second contact 163 formed along the second gate finger 155. In other words, the gate pad 153 is electrically connected to the pad peripheral section 156 and the second gate finger 155 via the first lead out wiring 160.

The first and second lead out wiring 160 and 161 are electrically connected to gate electrodes 138 embedded in the respective gate trenches 137, in a manner similar to Embodiment 5. This electrically connects the gate metal 152 to the gate electrodes 138 via the first and second lead out wiring 160 and 161, thereby forming a current pathway that leads surface current from the gate pad 153 to the gate electrodes 138.

As described above, in the semiconductor device 151, the first gate finger 154 does not contact the gate electrodes 138 at the portion of the first gate finger extending along the MIS gate structures 132 from the corner gate pad 153 to the adjacent corners, but rather contacts the gate electrodes 138 at the side that is opposite to the gate pad 153. In other words, the first gate finger 154 contacts the gate electrodes 138 of the MIS gate structures 132 at a position that is relatively far from the gate pad 153, which allows for inrush current to be restricted. Meanwhile, the second gate finger 155 and the pad peripheral section 156 contact the gate electrodes 138 of the MIS gate structures 132 at a position that is relatively close to the gate pad 153, but the second gate finger 155 is isolated from this gate pad 153. Furthermore, the second gate finger 155 and the pad peripheral section 156 are electrically connected to the gate pad 153 via the first and second lead out wiring 160 and 161; therefore, even if inrush current flows to the gate pad 153, this inrush current can be restricted. Accordingly, effects that are similar to those described in Embodiment 5 can be achieved.

Embodiments of the present invention as well as aspects related to Embodiment 5 and Embodiment 6 were described above, but the present invention can also be achieved with other aspects.

In Embodiments 2 and 3, for example, an example was described in which stripe-shaped emitter trenches 63 and 83 were formed in the lengthwise direction of the looped trenches 10, but the emitter trenches 63 and 83 may be formed in stripe shapes in the short side direction of the looped trenches 10 in a plan view. The emitter trenches 63 and 83 may be formed in a mesh shape inside the looped trenches 10.

In several embodiments above, an example was described in which the gate contact trenches 11 and the emitter contact trenches 12 are formed in an angular bridge-like shape in a plan view, but other structures such as an arc-like shape, a triangular bridge-like shape, or the like may be used, for example.

In Embodiments 1 to 4 and the modification examples thereof, an example was described in which the bottoms of the respective trenches 10, 11, 12, 63, and 83 are rounded from the side faces thereof, but the bottoms of the respective trenches 10, 11, 12, 63, and 83 may be formed horizontally.

Furthermore, in Embodiments 1 to 4 and the modification examples thereof, an example was described in which IGBTs are formed in the active area 4, but a CMOS (complementary MOS) may be formed instead of the IGBT. The example shown in FIG. 17 may be used as the configuration having the MOS structure, for example.

Figure 17:
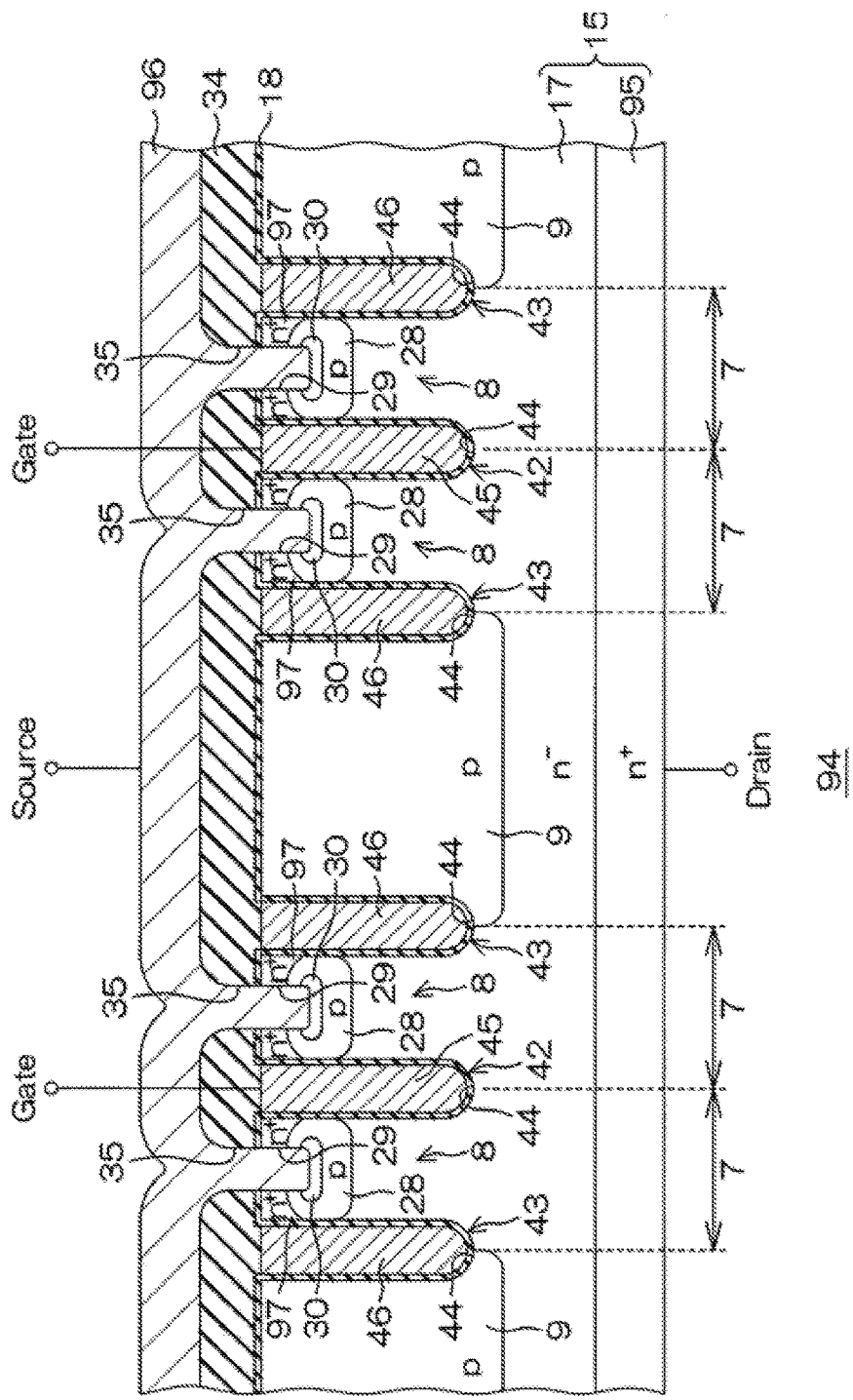
FIG. 17 is a schematic cross-sectional view of a modification example of the semiconductor device according to Embodiment 1.

FIG. 17 is a schematic cross-sectional view showing a modification example of the semiconductor device 1 according to Embodiment 1. In FIG. 17, the same reference characteristics are given to the primary elements shared with the semiconductor device 1, and an explanation thereof will not be repeated.

As shown in FIG. 17, in this modification example, a semiconductor device 94 has an $n^+$ drain region 95 instead of the $p^+$ collector region 16. In other words, in the semiconductor device 94, MOSFETs are formed instead of IGBTs. In this case, a source electrode 96 ($n^+$ source region 97) is provided instead of the emitter electrode 6 ($n^+$ emitter region 31) for the IGBT. Needless to say, the respective semiconductor devices 61, 81, 91 in Embodiments 2 to 4 may use the $n^+$ drain region 95 instead of the $p^+$ collector region 16 and may have MOSFET structures.

In several of the embodiments described above, an example was described in which IGBTs were formed in the active area 4, but various types of semiconductor elements and circuit elements such as BJTs (bipolar junction transistors), JFETs (junction field effect transistors), capacitors, resistors, and the like may be formed instead of the IGBTs. Furthermore, an integrated circuit such as an LSI (large scale integration), SSI (small scale integration), MSI (medium scale integration), VLSI (very large scale integration), ULSI (ultra very large scale integration), and the like may be formed by combinations of these semiconductor elements, circuit elements, and the like.

In the respective embodiments described above, a configuration is possible in which the conductivity type of the various semiconductor regions, such as the p-type floating region 9, the $p^+$ collector region 16, and the $n^-$ drain region 17 is inverted. Accordingly, in this case, the p-type floating region 9 would be an n-type floating region, the $p^+$ collector region 16 would be an $n^+$ collector region, and the $n^-$ drain region 17 would be a p-type drain region. Needless to say, the conductivity type of the other semiconductor regions would also be flipped.

Figure 18:
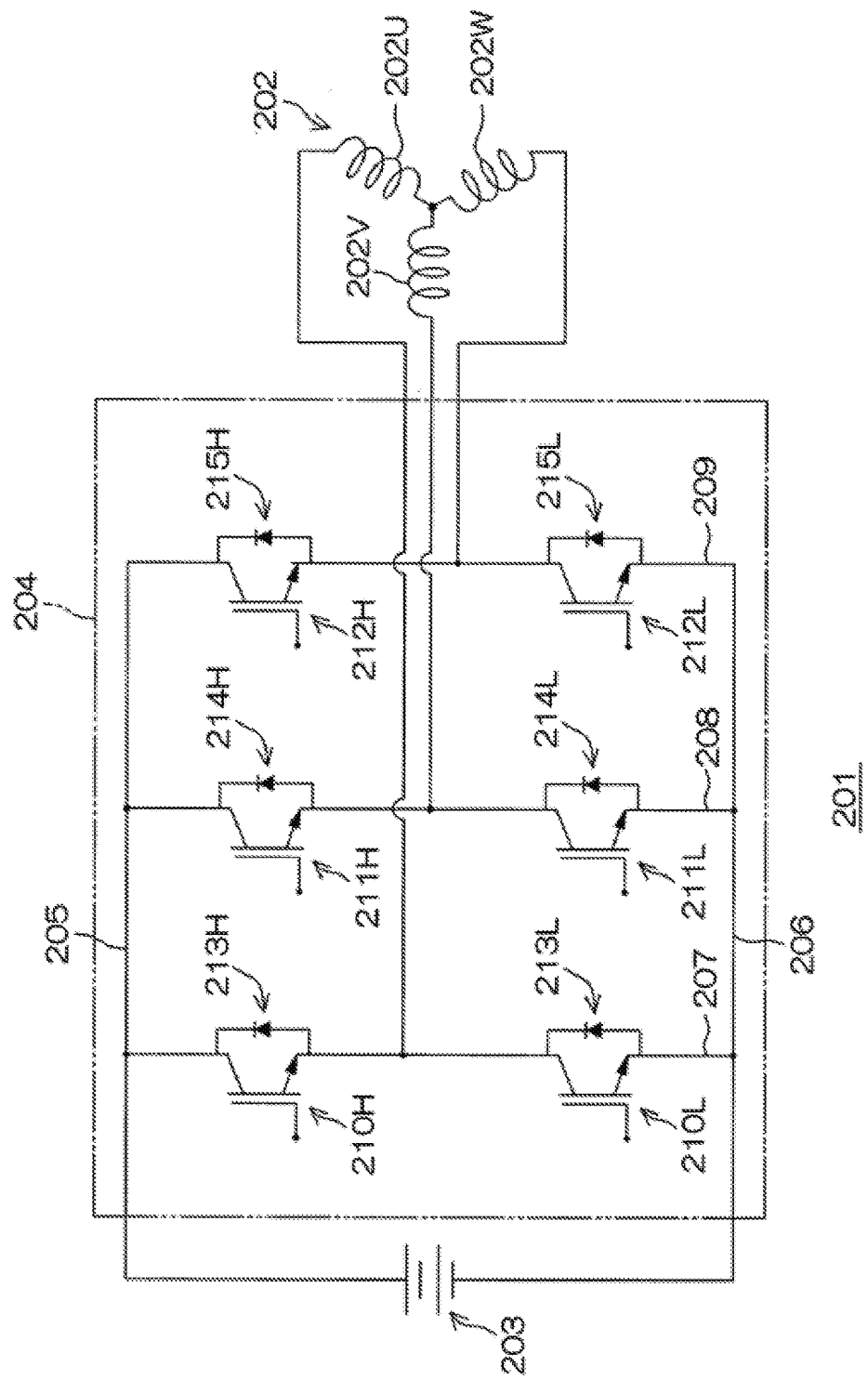
FIG. 18 is a circuit map for explaining an inverter circuit using the semiconductor device according to Embodiments 1 to 4.

As shown in FIG. 18, the respective semiconductor devices 1, 61, 81, and 91 in Embodiments 1 to 4 can be applied to an inverter circuit.

FIG. 18 is a circuit map for explaining an inverter circuit 201 to which the respective semiconductor devices 1, 61, 81, and 91 of Embodiments 1 to 4 are applied.

The inverter circuit 201 is a three-phase inverter circuit that connects to a three-phase motor 202 as a load. The inverter circuit 201 includes a direct power source 203 and a switch unit 204.

The direct power source 203 is 700V, for example. A high voltage wiring line 205 is connected to the high voltage side of the direct power source 203, and a low voltage wiring line 206 is connected to the low voltage side. The switch unit 204 has three arms 207 to 209 corresponding to respective phases of the three-phase motor 202: U-phase 202U, V-phase 202V, and W-phase 202W.

The arms 207 to 209 are connected in parallel between the high voltage wiring line 205 and the low voltage wiring line 206. The arms 207 to 209 respectively have high side transistors 210H to 212H on the high voltage side (semiconductor devices 1, 61, 81, and 91), and low side transistors 210L to 212L (semiconductor devices 1, 61, 81, and 91) on the low voltage side. Freewheeling diodes 213H to 215H and 213L to 215L are respectively connected in parallel to the transistors 210H to 212H and 210L to 212L at an orientation such that forward current flows from the low voltage side to the high voltage side.

In the inverter circuit 201, alternating current is sent to the three-phase motor 202 by alternately switching ON/OFF control of the high side transistors 210H to 212H and the low side transistors 210L to 212L of the respective arms 207 to 209, or in other words, by alternately switching states in which one transistor is switched ON and the other transistor is switched OFF. Meanwhile, power to the three-phase motor 202 can be stopped by switching OFF both transistors. In this manner, switching operation of the three-phase motor 202 is performed.

In Embodiment 5 described above, an example was described in which the first removal area 110 is formed in a looped shape so as to surround the gate pad 105 (see FIG. 10), but a plurality of the first removal areas 110 may be formed in a looped shape so as to selectively surround the gate pad 105. In FIG. 10, the first removal area 110 does not have to be formed on the left side of the gate pad 105, for example. In this case, the pad peripheral section 107 and the gate finger 106 are electrically connected to the gate pad 105 via the metal constituting the gate metal 103. In this case too, the first removal area 110 surrounding three sides of the gate pad 105 must be avoided in order for current supplied to the gate pad 105 to flow to the pad peripheral section 107, thus making it possible to lightly reduce inrush current to the pad peripheral section 107.

In Embodiment 5 described above, an example was described in which the second removal area 111 selectively surrounds a portion around the gate pad 105 (see FIG. 10), but the second removal area 111 may surround the entirely of the gate pad 105.

In Embodiment 5 described above, an example was described in which the first lead out wiring 115 is formed in a closed loop shape in a plan view in a layer under the gate pad 105, but the first lead out wiring 115 may be formed in a looped shape as long as the gate pad 105 electrically connects to the pad peripheral section 107. Accordingly, the first lead out wiring 115 may be formed in a line shape in an area under the gate pad 105.

In Embodiment 5 described above, an example was described in which the gate finger lead out wiring 116 is formed having a narrower width than the gate finger 106 (see FIG. 11), but the gate finger lead out wiring 116 may be formed having a greater width than the gate finger 106.

In Embodiment 5 described above, an example was described in which the second lead out wiring 117 is formed so as to selectively surround the first lead out wiring 115 (see FIG. 11), but the second lead out wiring 117 may be formed so as to surround the entirely of the first lead out wiring 115. In this case, the second pad peripheral section contact 121 (see FIG. 12) may be formed in a square looped shape in a plan view so as to surround the entirely of the first pad peripheral section contact 119.

In Embodiment 6 described above, an example was described in which the removal area 157 is formed along the gate pad 153 (see FIG. 15), but the removal area 157 may be formed so as to surround the entirety of the gate pad 153. In this case, the first gate finger 154 is also formed isolated from the gate pad 153. Even with this type of configuration, the first lead out wiring 160 is formed so as to straddle the gate pad 153 and the first gate finger 154, thus making it possible to electrically connect the gate pad 153 and the first gate finger 154. Accordingly, surface current flowing through the surface of the gate pad 153 can also be restricted between the gate pad 153 and the gate finger 154.

In Embodiments 5 and 6 described above, an example was described in which the gate trenches 137 are formed in the active area 102 in stripe shapes in a plan view, but the gate trenches 137 may be formed in a mesh shape in a plan view. In this case, the single cells 136 of the IGBTs are formed in an area surrounded by the mesh-shaped gate trenches 137.

Figure 19:
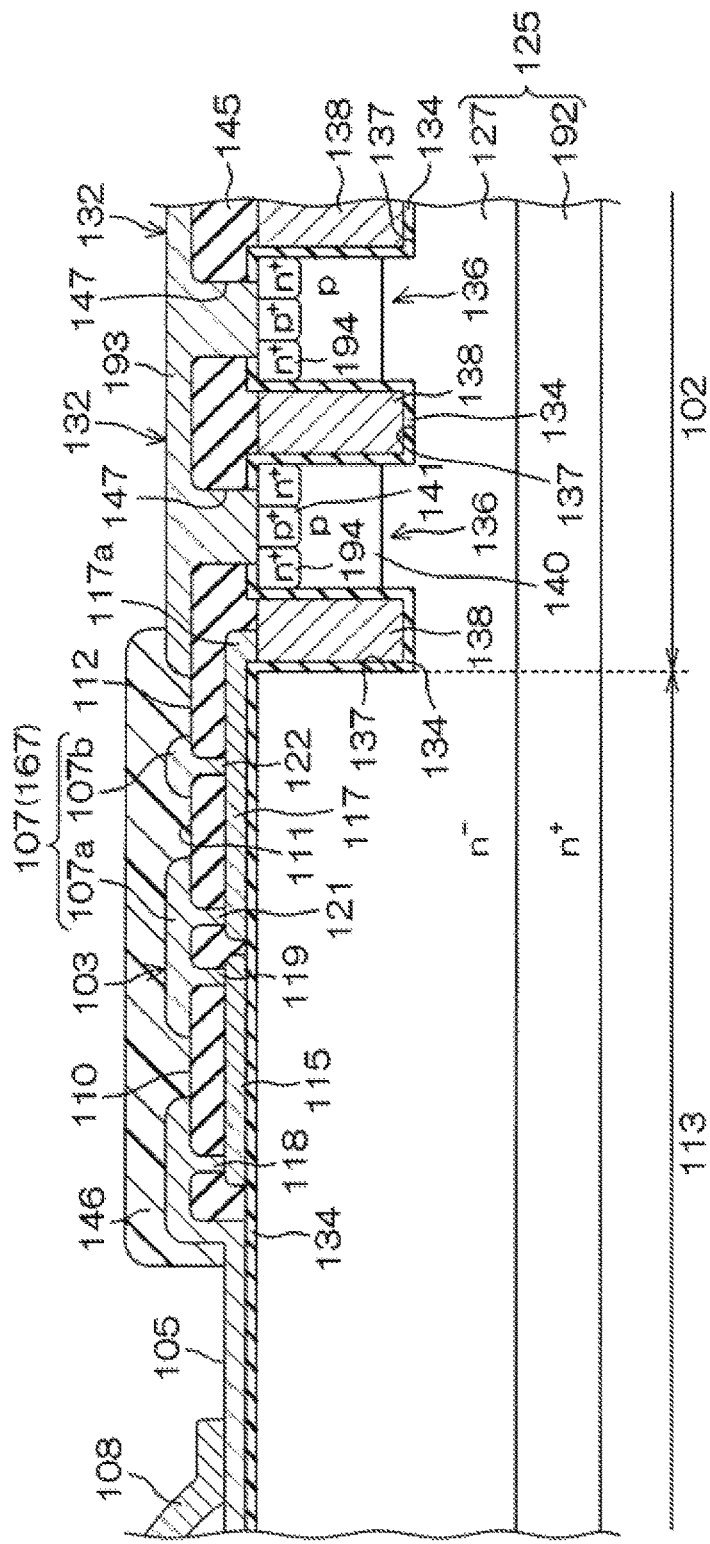
FIG. 19 is a schematic cross-sectional view of a modification example of the semiconductor device according to Embodiments 5 and 6.

In Embodiments 5 and 6 described above, an example was described in which the IGBTs are formed in the active area 102, but the example shown in FIG. 19 may be adopted.

FIG. 19 is a schematic cross-sectional view showing a modification example of the semiconductor devices 101 and 151 according to Embodiments 5 and 6. In FIG. 19, the same reference characters are given to the primary elements shared with the semiconductor devices 101 and 151, and an explanation thereof will not be repeated.

As shown in FIG. 19, in this modification example, a semiconductor device 191 has an $n^+$ drain region 192 instead of a $p^+$ collector region 126. In other words, in the semiconductor device 191, MOSFETs are formed instead of IGBTs. In this case, a source electrode 193 ($n^+$ source region 194) of the MOSFETs is provided instead of the emitter electrode 104 ($n^+$ emitter region 142) of the IGBTs.

Even with this type of configuration, the gate electrode 183 of MIS gate structures 132 in the MOSFETs can be suppressed from turning ON locally, which makes it possible for effects similar to those with the IGBTs to be attained. Furthermore, a semiconductor substrate 125 may use SiC (silicon carbide) to form SiC-IGBT, or may form a SiC-MOSFET.

In Embodiments 5 and 6 described above, an example was described in which trench-gate IGBTs are formed in the active area 102, but a planar-gate IGBT having a gate electrode formed on the surface of the semiconductor substrate 125 across an insulating film 134 may be adopted. Furthermore, planar-gate MOSFETs may be adopted instead of the planar-gate IGBTs.

In Embodiments 5 and 6 described above, an example was described in which the bottom of the gate trenches 137 are formed in parallel to the surface of the semiconductor substrate 125, but the bottom of the gate trenches 137 may be formed so as to be rounded from the side faces thereof. In Embodiments 5 and 6 described above, an example was described in which the side faces of the gate trenches 137 are formed at a right angle to the surface of the semiconductor substrate 125, but the side faces of the gate trenches 137 may be formed in a tapered shape having a width that gradually narrows from the opening thereof towards the bottom.

In Embodiments 5 and 6 described above, an example was described in which the IGBTs are formed in the active area 102, but various types of semiconductor elements and circuit elements such as CMOS (complementary MOS), BJTs (bipolar junction transistors), JFETs (function field effect transistors), capacitors, resistors, and the like may be used instead of the IGBTs. Furthermore, an integrated circuit such as an LSI (large scale integration), SSI (small scale integration), MSI (medium scale integration), VLSI (very large scale integration), ULSI (ultra very large scale integration), and the like may be formed by combinations of these semiconductor elements, circuit elements, and the like.

In Embodiments 5 and 6 described above, a configuration may be used in which the conductivity type of the various semiconductor regions of the p$^+$ collector region 126, the n$^-$ drain region 127, the p-type base regions 140, and the n$^+$ emitter regions 142 are reversed.

Figure 20:
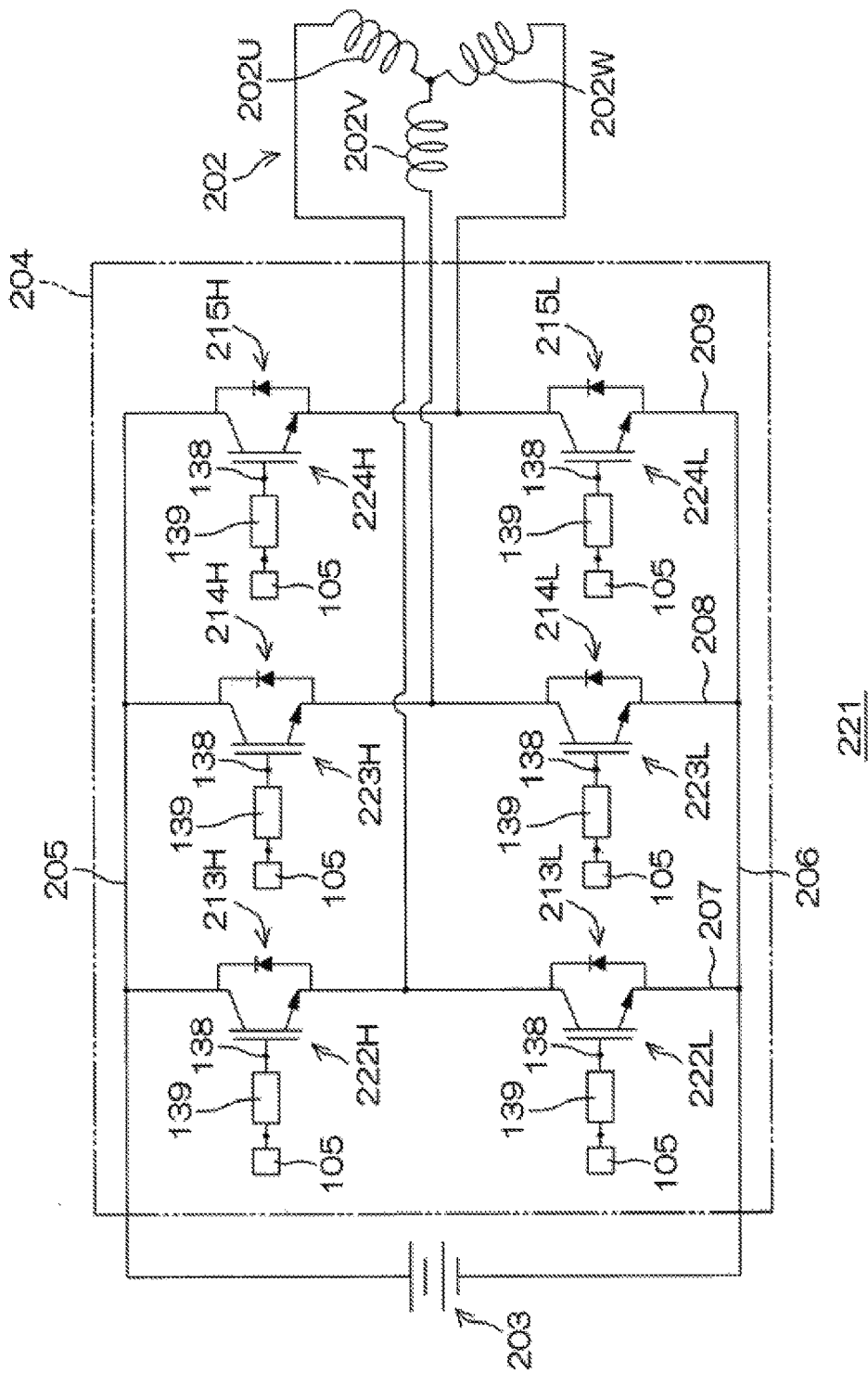
FIG. 20 is a circuit map for explaining an inverter circuit using the semiconductor device according to Embodiments 5 and 6.

As shown in FIG. 20, the semiconductor devices 101 and 105 described in Embodiments 5 and 6 can be applied to an inverter circuit 221.

FIG. 20 is a circuit map for explaining the inverter circuit 221 to which the semiconductor devices 101 and 151 of Embodiments 5 and 6 have been applied.

The inverter circuit 221 differs from the inverter circuit 201 shown in FIG. 18 in that high side transistors 222H to 224H (semiconductor devices 101 and 151) and low side transistors 222L to 224L (semiconductor devices 101 and 105) are provided instead of the high side transistors 210H to 212H and the low side transistors 210L to 212L. The other elements are similar to the inverter circuit 201 shown in FIG. 18.

As shown in FIG. 20, the respective high side transistors 222H to 224H and the low side transistors 222L to 224L have a current restricting unit 139 interposed between the gate pad 105 and the gate electrode 138 (see also FIG. 13B). Therefore, with these current restricting units 139, it is possible to reduce switching loss caused by resonance noise during switching ON.

Embodiments 1 to 4 described above and the various modification examples described above can be appropriately combined with Embodiments 5 to 6 described above and the various modification examples described above to exert the effects of both and to exert a synergy effect thereof. These types of diverse combinations are also embodiments of the present invention.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A method for manufacturing a semiconductor device, comprising:

forming a floating region of a first conductivity type selectively in a semiconductor substrate of a second conductivity type and a trench in the semiconductor substrate at a position bordering the floating region;

forming an insulating film on a surface of the semiconductor substrate and on inner surfaces of the trench;

thereafter, forming a conductive layer on the surface of the semiconductor substrate and on the inner surfaces of the trench having the insulating film thereon;

performing anisotropic etching on the conductive layer to pattern the conductive layer such that, in the trench, the patterned conductive layer provides an emitter connecting part on one inner surface of the trench at a side facing the floating region and a trench gate on another inner surface of the trench at a side opposite thereto, the emitter connecting part and the trench gate being separated from each other by a gap;

forming a center insulating film that separates and insulates the emitter connecting part from the trench gate in the trench;

forming an emitter region of the second conductivity type in the surface of the semiconductor substrate and a base region of the first conductivity type under the emitting region at a side of the trench opposite to the floating region;

thereafter, forming an interlayer insulating film on the surface of the semiconductor substrate;

forming a contact trench that extends vertically downwardly and penetrates through the interlayer insulating film and the emitter region, thereby reaching an inside of the base region thereunder;

forming a base contact region of the first conductivity type in the inside of the base region that has been exposed by the contact trench;

forming an emitter electrode on the surface of the semiconductor substrate so that the emitter electrode contacts the emitter region, the base region, and the base contact region through the contact trench; and forming a collector region of the first conductivity type on a rear surface of the semiconductor substrate, wherein the forming of the floating region and the trench includes:

selectively doping the surface of the semiconductor substrate with impurities of the first conductivity type to form a doped region in the semiconductor substrate;

forming the trench at a position bordering the doped region;

oxidizing the surface of the semiconductor substrate having the trench therein to form a sacrificial oxide film on said surface and on the inner surfaces of the trench;

annealing the semiconductor substrate having the sacrificial oxide film formed thereon to diffuse the impurities of the first conductive type into the semiconductor substrate so as to form the floating region of the first conductivity type in the semiconductor substrate; and removing the sacrificial oxide layer.

2. The method according to claim 1, wherein the forming of the center insulating film includes:

forming an insulating layer on the surface of the semiconductor substrate including the trench, thereby filling the gap between the emitter connecting part and the trench gate in the trench; and performing etch-back on the insulating layer so that a surface thereof is substantially leveled with the surface of the semiconductor substrate to leave the center insulating film in the trench.

3. The method according to claim 1, wherein the forming of the floating region and the trench also includes forming a second trench in the semiconductor layer, said second trench reaching at least the floating region and having a same width as the trench;

the performing of the anisotropic etching includes patterning the conductive layer such that, in the second trench, the patterned conductive layer provides a pair of second emitter connecting parts that are insulated from each other in the second trench by a gap; and the forming of the center insulating film includes forming an insulating film that separates and insulate the pair of second emitter connecting parts in the second trench.

* * * * *